United States Patent
Datta et al.

(10) Patent No.: US 8,584,075 B2
(45) Date of Patent: Nov. 12, 2013

(54) METHOD AND APPARATUS FOR CHARACTERIZING AND REDUCING PROXIMITY EFFECT ON CELL ELECTRICAL CHARACTERISTICS

(75) Inventors: Animesh Datta, San Diego, CA (US); Pratyush Kamal, San Diego, CA (US); Prayag B. Patel, San Diego, CA (US); Xiaonan Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 245 days.

(21) Appl. No.: 13/027,359

(22) Filed: Feb. 15, 2011

(65) Prior Publication Data

US 2012/0210284 A1 Aug. 16, 2012

(51) Int. Cl.
*G06F 17/50* (2006.01)
(52) U.S. Cl.
USPC ........... 716/136; 716/101; 716/106; 716/110; 716/111
(58) Field of Classification Search
USPC .................. 716/100, 101, 106, 110, 111, 136
See application file for complete search history.

(56) References Cited

U.S. PATENT DOCUMENTS

| 7,476,957 | B2 | 1/2009 | Watanabe et al. |
| 7,716,612 | B1 | 5/2010 | Gupta et al. |
| 2009/0326873 | A1 | 12/2009 | Wang et al. |
| 2010/0031214 | A1 | 2/2010 | Hou et al. |

OTHER PUBLICATIONS

Darsun Tsiena et al., "Context-specific leakage and delay analysis of a 65nm standard cell library for lithography-induced variability", SOC Conference, 2007 IEEE International, IEEE, Piscataway, NJ, USA, Sep. 26, 2007, pp. 261-268, XP031274171, ISBN: 978-1-4244-1592-2.

Hailong Jiao et al., "Cellwise OPC Based on Reduced Standard Cell Library", Quality Electronic Design, 2008. ISQED 2008. 9th International Symposium on, IEEE, Piscataway, NJ, USA, Mar. 17, 2008, pp. 810-814, XP031239634, ISBN: 978-0-7695-3117-5.

International Search Report and Written Opinion—PCT/US2012/025139—ISA/EPO—Jun. 18, 2012.

Xi-Wei Lin et al., "Layout Proximity Effects and Modeling Alternatives for IC Designs", IEEE Design & Test of Computer, IEEE Service Center, Mar. 1, 2012, vol. 27, No. 2,p. 18-25, XP011305153, ISSN: 0740-7475.

Xi-Wei Lin; Moroz, V., "Layout Proximity Effects and Modeling Alternatives for IC Designs". Design & Test of Computers, IEEE, Mar.-Apr. 2010, vol. 27, Issue 2, pp. 18-25.

H. Aikawa, E. Morifuji, et al., "Modeling and Characterization in Standard Cell in 45 nm CMOS with Stress Enhancement Technique," 2008 IEEE Symposium on VLSI Technology Digest of Technical Papers, pp. 90-91.

*Primary Examiner* — Sun Lin
(74) *Attorney, Agent, or Firm* — Sam Talpalatsky; Nicholas J. Pauley; Joseph Agusta

(57) ABSTRACT

Circuit elements are characterized for effects of proximity context on electrical characteristic. Based on the characterization, proximity context cell models, and corresponding modeled electrical characteristic values are obtained. Logic cells are characterized and modeled according to the proximity context cell models. Optionally the electrical characteristic can be time delay, leakage, dynamic power, or coupling noise among other parameters.

94 Claims, 7 Drawing Sheets

US 8,584,075 B2

METHOD AND APPARATUS FOR CHARACTERIZING AND REDUCING PROXIMITY EFFECT ON CELL ELECTRICAL CHARACTERISTICS

FIELD OF DISCLOSURE

The disclosure pertains to integrated circuits and, more particularly, to methods for designing integrated circuits, and to integrated circuits embodying such methods.

BACKGROUND

Semiconductor integrated circuit chips (ICs) generally include a semiconductor substrate supporting at different locations on its surface circuits such as random access memory (RAM), arithmetic logic units (ALUs), multiplexers (MUXs), and addressable registers, interconnected by various data signal paths. These circuits are typically formed of various lower level logic circuits, or "cells," such as NAND gates, NOR gates, inverter gates, and various types of latches and flip-flops (referenced generically "register cells"). The cells are typically interconnected such that the output of each connects, through respective signal paths, to inputs of other cells. Currently available large scale ICs can include millions of these cells.

The IC register cells can be edge-triggered devices, having a data input, a clock input and a data output. The clock is typically a two-level signal, having periodic edges, i.e., transitions, from one of a high or low voltage level to the other level.

The register cells may require the data signal to arrive and be stabilized at the data signal input prior to the clock edge arriving, by an amount of time not less than a given "set-up." In addition, register cells may require the data signal to remain stable at the data signal input for a minimum "hold" time subsequent to the clock edge. If either the set-up or hold time is not met the register cell may fail to capture the data signal that was on its input.

At low clock rates there is typically no difficulty in arranging the cells to ensure that these set-up and hold times are met, for all of the register cells, over a wide range of process, voltage, or temperature (PVT) variations.

Meeting these time requirements has become more challenging, though, as clock frequencies have become higher. For example, current commercially available large scale ICs may operate at clock rates higher than approximately 2 GHz. At this example clock rate the successive clock edges are spaced in time by only 500 picoseconds, which results in a narrow allowable timing spread.

There are known IC design techniques intended to assist in the generation of IC layouts that meet these timing requirements, but each has significant costs and/or inherent shortcomings. The costs and shortcomings are seen particularly when attempting to determine the delay time through cells that have a small geometry and are located in a densely packed array of cells. The reason is that determining the delay for such cells must take into consideration the spacing and alignment of the active areas of that cell relative to the active areas of the neighboring cells. This spacing and alignment can be referred to as the "proximity context of the cell" or, alternatively, as the "cell proximity context." Taking the cell proximity context into consideration when determining cell delays can exponentially increase the computational resources required for optimizing IC design.

FIG. 1 shows one binned distribution of a timing spread 12, and static current leakage variations 14, identified by example simulations of a number of instances of given standard cell within a given IC.

For example, one known technique for calculating the delays of densely packed, small geometry cells is to characterize their timings based on a set of fixed proximity contexts, and modeling the timing effects of proximity contexts by varying the RC time constant of the cell using a fastest (best) and slowest (worst) RC. Then, a slowest RC-based netlist and a pessimistic or slowest operating PVT timing corner are used to determine, or estimate, if setup constraints and timing slack are met, while a faster RC-based netlist and fastest operating PVT timing corner are used to determine, or estimate if hold constraints are met.

This RC-based approach, although perhaps practical in terms of the computational resources required, has significant shortcomings. One is that the technique may produce overly pessimistic timing and power values for each cell. The resulting IC design, being based on these pessimistic timing and power values, may occupy a larger die area, and/or burn more dynamic power. In addition, ICs incorporating the RC-based design may impact the yield of ICs due to skewing between data and clock paths, not ascertainable from RC-based design.

As another example illustrating shortcomings of known techniques to estimate cell delay and leakage of tightly packed, small geometry cells, one of these known methods is to exhaustively model the cell timing, and leakage for each and every possible context. The exhaustive model information can then accurately estimate, using the multiple context-based cell timings, all timing skews in all setup/hold paths, for various PVT corners of interest. However, ASICs today may have millions of gates with thousands of different standard cells. The computational resources required for this exhaustive modeling approach render it impractical for many applications.

SUMMARY

The following presents a simplified summary of one or more aspects to provide a basic understanding of such aspects. This summary is not an extensive overview of all contemplated aspects, and is intended to neither identify key nor critical elements of all aspects nor delineate the scope of any aspect. Its sole purpose is to present some concepts of one or more aspects in a simplified form as a prelude to the more detailed description presented below.

According to one exemplary embodiment, a method is provided for modeling electrical characteristics of a layout of cells having given circuit elements, and methods may include determining a relationship between a proximity context of a reference circuit element and an electrical characteristic of the reference circuit element; and generating, for at least one of the cells, a plurality of cell proximity context models, based on a given model of the cell, a set of electrical characteristic, and the determined relationship. An example method may further include generating a layout of cells having at least one cell; characterizing at least one cell of the layout of cells, based on a value of a given structural parameter of the least one cell, as one of its plurality of cell proximity context models; and generating a discrete electrical characteristic model of the cell layout by substituting the at least one cell with the cell proximity context model result.

According to one aspect, the proximity context of the reference circuit may be represented as N-dimensional proximity context vectors representing N physical parameters of the proximity context.

According to another aspect, generating the plurality of cell proximity context models may include: selecting a plurality of reference proximity contexts based on the determined relationship and at least one given electrical characteristic value; and generating the plurality of cell proximity context models based on a given model of the cell and the plurality of reference proximity contexts.

In another aspect, the electrical characteristic is a time delay, and a method according to the aspect may further include generating, for each of the plurality of proximity contexts, a corresponding plurality of modeled time delay values, by performing an electrical characteristic analysis on each of the plurality of proximity contexts. Further to this and other aspects, the characterized discrete electrical characteristic model of the layout of cells may include the modeled time delay value of the context model result of the characterizing. In addition, in this and other aspects, the selecting may select, based on a target electrical characteristic value, a minimum reference proximity context, an average reference proximity context and a maximum reference proximity context. Still further to this and other aspects, a generating the plurality of cell proximity context models, based on a given model of the cell and the plurality of reference proximity contexts, may generate a maximum electrical characteristic cell proximity context model, an average electrical characteristic cell proximity context model, and minimum electrical characteristic cell proximity context model.

In another aspect, the electrical characteristic may be a time delay, and a method further to this aspect may also include generating, based on the cell proximity context model, a modeled maximum time delay value, a modeled average time value and a modeled minimum time delay value.

According to another aspect, the selected plurality of reference proximity contexts may be seed reference contexts and, further to this and other aspects, methods may include verifying the seed reference contexts. In one aspect, verifying seed reference contexts may include generating, for each of a plurality of given reference cells, a plurality of reference cell proximity contexts, based on a given model of the reference cell and the plurality of seed reference proximity contexts, as well as generating, for each of the given reference cells having a generated plurality of plurality of reference cell proximity contexts, a corresponding plurality of modeled reference electrical characteristic values.

Further, in one aspect a verifying of the seed reference contexts may include generating a layout of a set of cells, having at least one instance of reference cells among the plurality of reference cells; performing an electrical characteristic analysis on instances of reference cells in the set and generating a corresponding reference standard electrical characteristic.

In addition, in one aspect verifying seed reference contexts may include characterizing the reference cell at each of a plurality of instances of reference cells in the set as one of the reference cell's generated plurality of reference proximity contexts. Further to this and other aspects, such characterizing may be based on a value of a given structural parameter of the reference cell.

According to one aspect, methods may include generating a characterized discrete model of all elements of the set by substituting instances of reference cells in the set with the modeled electrical characteristic value of the reference cell's characterized reference proximity context.

According to one exemplary embodiment, a computer product having a computer readable medium is provided, storing computer-readable instructions that, when read and executed by a processor, cause the processor to perform operations for modeling electrical characteristics of a layout of cells having given circuit elements. According to one example, the instructions may include instructions that cause a processor to determine a relationship between a proximity context of a reference circuit element and an electrical characteristic of the reference circuit element; generate, for at least one of the cells, a plurality of cell proximity context models, based on a given model of the cell, a set of electrical characteristic, and the determined relationship.

In one aspect, the stored instructions may further cause a processor to generate a layout of cells having at least one cell; characterize at least one cell in the layout of cells, based on a value of a given structural parameter of the least one cell, as one of its plurality of cell proximity context models; and generate a characterized discrete electrical characteristic model of the cell layout by substituting the at least one cell with the cell proximity context model result of the characterizing.

According to one aspect, instructions that cause the processor to generate the plurality of cell proximity context models include instructions that cause a processor to select a plurality of reference proximity contexts based on the determined relationship and at least one given electrical characteristic value; and generate the plurality of cell proximity context models based on a given model of the cell and the plurality of reference proximity contexts.

According to one aspect, instructions that cause a processor to generate the plurality of cell proximity context models may include instructions that cause a processor to select a plurality of reference proximity contexts based on the determined relationship and at least one given electrical characteristic value; and generate the plurality of cell proximity context models based on a given model of the cell and the plurality of reference proximity contexts.

According to one aspect, instructions that cause a processor to generate, for each of the plurality of proximity contexts, a corresponding plurality of modeled electrical characteristic values may include instructions that cause a processor to perform an electrical characteristic analysis on each of the plurality of proximity contexts, wherein the characterized discrete electrical characteristic model of the layout includes the modeled electrical characteristic value of the context model result of the characterizing.

According to one example embodiment, a method is provided for modeling electrical characteristics of a layout of cells having given circuit elements, and may include steps of: determining a relationship between a proximity context of a reference circuit element and an electrical characteristic of the reference circuit element; generating, for at least one of the cells, a plurality of cell proximity context models. The cell proximity context models may be generated based on a given model of the cell, a set of electrical characteristic, and the determined relationship. One example may include generating a layout of cells having at least one cell; and characterizing at least one cell in the layout of cells, based on a value of a given structural parameter of the least one cell, as one of its plurality of cell proximity context models. One example may further include generating a characterized discrete electrical characteristic model of the cell layout by substituting the at least one cell with the cell proximity context model result of the characterizing.

In one aspect, the step of generating the plurality of cell proximity context models may includes steps of: selecting a plurality of reference proximity contexts based on the determined relationship and at least one given electrical characteristic value; generating the plurality of cell proximity context models based on a given model of the cell and the plurality of reference proximity contexts.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
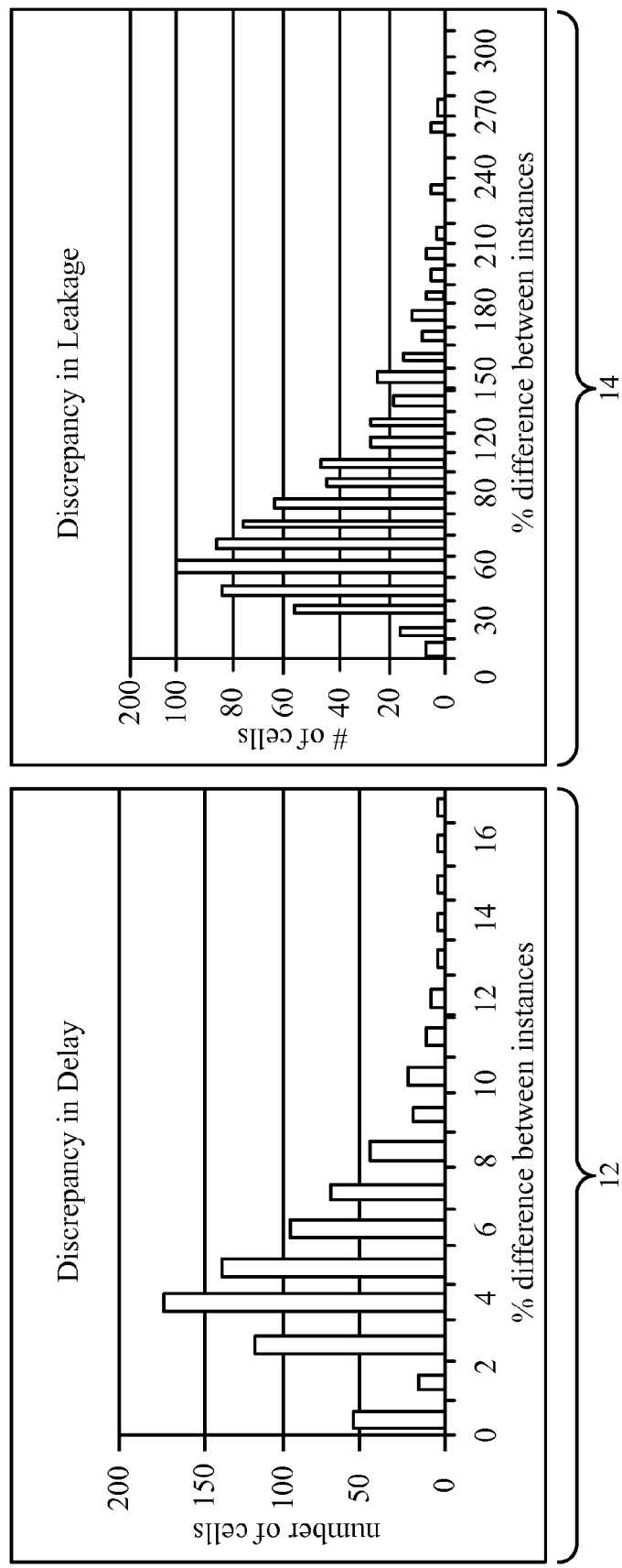
FIG. 1 shows a binned distribution of a timing spread, and static current leakage variations, exhibited by instances of given standard cell within a given IC.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the proximity context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequences of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Example acts and means, and example combinations of acts and means, may be referred to as "steps" in relation to practicing methods according to the embodiments. As will be understood by a person of ordinary skill in the art from this disclosure, though, methods according to its embodiments may be performed using a different segmenting of the example acts and means, and/or different ordering of the acts or means, or by various substitutes and equivalents that will be readily apparent to such persons from this disclosure.

In overview, in one example method according to one embodiment a reference device model is provided and placed in a proximity context model that is defined by N parameters, corresponding to an N-dimensional proximity context space. Example N-dimensional proximity context spaces are described in greater detail at later sections of this disclosure. The reference device model may represent an NMOS or PMOS device or, for example, another n-type or p-type device. The reference device model may represent any other circuit element, in any technology, in which signal delay of a circuit element, or any other electrical characteristic of the circuit element, is dependent, even in part, on the proximity of its neighboring circuit elements. Placing the reference device model in a proximity context model in a simulation program, for example, HSPICE, available from Avant!, Inc., or any of the various equivalent simulation tools available from other vendors.

The reference proximity context model may include the reference device model and its spatial relation to models of neighboring devices. The format of the reference proximity context model is a design choice, but preferably should interface with the format in which the cell library stores cells because, as will be described in greater at later sections, variations of the reference proximity context model may be used to modify cell models in the cell library. As will also be described, circuit extraction and timing analysis may be performed on the modified cell models. Therefore, the reference proximity context model should be formatted such that a circuit extraction, sufficient for a timing analysis, can be performed on the modified cell model. Persons of ordinary skill in the arts pertaining to IC design and cell libraries will, in view of this disclosure, be able to readily determine such a reference proximity context model format to practice according to the disclosed embodiments.

In the reference proximity context model the neighboring devices may be, but are not necessarily, arranged in a north-south-east-west manner around the reference device model. The N-dimensional proximity context space, and therefore the N parameter values, may relate to spacing between particular regions of the reference device model and particular regions of modeled neighboring devices. Examples will be described in greater detail at later sections. Next, the reference proximity context model is used to identify the timing delay variation by the reference device model as the parameters of the proximity context are varies within the N-dimensional proximity context space.

Figure 2:
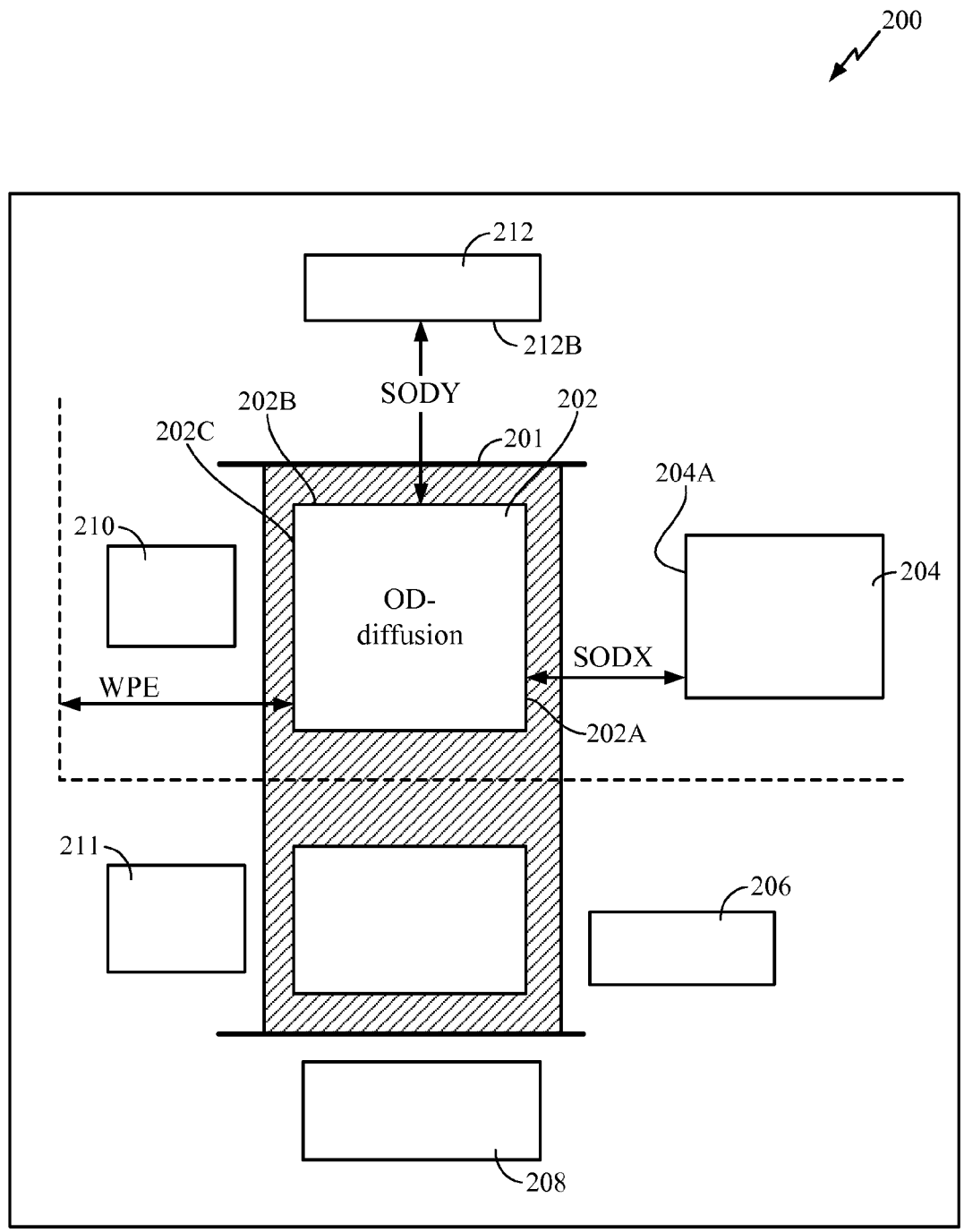
FIG. 2 shows a model standard cell proximity context according to one aspect.

FIG. 2 shows a proximity context model 200 of an example reference device model 201 having an active diffusion region 202 with modeled neighbor regions, labeled 204, 206, 208, 210, 211 and 212. The proximity context model 200, its depicted arrangements, and its depicted proportion of dimensions are only for purposes of example. Other reference device models, and other arrangements of modeled neighbor regions for characterizing context proximity effects on the reference device model, will become apparent to persons of ordinary skill in the art in view of this disclosure.

The FIG. 2 context model 200 implements the N-dimensional context space as a three-dimensional context space, the space being defined by example parameters labeled SODX, SODY and WPE (well proximity extension). The example parameter SODX represents a spacing from the right edge 202A of the active diffusion region 202 of the reference device model to the far left edge 204A of the neighboring active diffusion region 204. The example parameter SODY represents a spacing from the top edge 202B of the reference device active diffusion region 202 to the bottom edge 212B of the neighboring active diffusion region 212. It will be understood that the suffixes of "X" and "Y" for SODX and SODY, respectively, simply differentiate between arbitrary horizontal and vertical directions on the plane of the substrate (not shown), and may be interchanged. The example parameter WPE represents a well diffusion effect, corresponding to the spacing from the left edge 202C or right edge 202A of the device diffusion region 202 to the neighboring edge of nwell region 201.

It will be understood that except where stated otherwise, the particular labels this disclosure uses for example parameters, such as the labels SODX, SODY, and WPE for the example parameters depicted in FIG. 2, are arbitrary reference names, not intended as imparting any information other than being a label for, and subsequent reference to specific examples used in this disclosure. It will also be understood that the FIG. 2 depicted context parameters SODX, SODY and WPE are only examples. Other N-dimensional context spaces may become apparent to persons of ordinary skill in the art, in view of this disclosure, and or upon practicing methods of the disclosed embodiments. For example, the FIG. 2 context model 200 represents a three-dimensional context space, but other values of N may be used, for example two or four. Further, parameters other than horizontal and vertical spacing may be used, and/or functions of one or more parameters may used for characterizing particular features of the context Continuing in overview of one example method according to one embodiment, the proximity context model may be placed on a simulation tool such as HSPICE, and the state of the N-dimensional proximity context may then be moved by, for example, incremental movement over a given range of each of the N parameter values. At each increment, a timing analysis may be performed to obtain the time delay. In the FIG. 2 example proximity context model 200, the incremental movement may be performed by, for example, varying its example defining parameters SODX, SODY and WPE, over a given range. As will be understood by persons of ordinary skill in the art from this disclosure, the extent of the given range may be application-specific. The range may span at least the full range of proximity contexts that may, with any identifiable probability, be actualized in the IC design or the fabricated IC. Referring to the FIG. 2 example proximity context model, for obtaining the reference device model's proximity context versus delay characteristic, each of the incremental positions of the SODX, SODY and WPE may be represented as a three-tuple, and the delay may, if desired, be expressed as DELAY(SODX, SODY, WPE).

It will be understood that the above-described variation of proximity context parameters on the simulation tool may also be used to obtain proximity context versus current leakage characteristics. It will likewise be understood, and appreciated, that the above-described variation of proximity context parameters on the simulation tool may be used to obtain proximity context versus other electrical characteristics such as dynamic power, noise and/or I-V curve.

Figure 3:
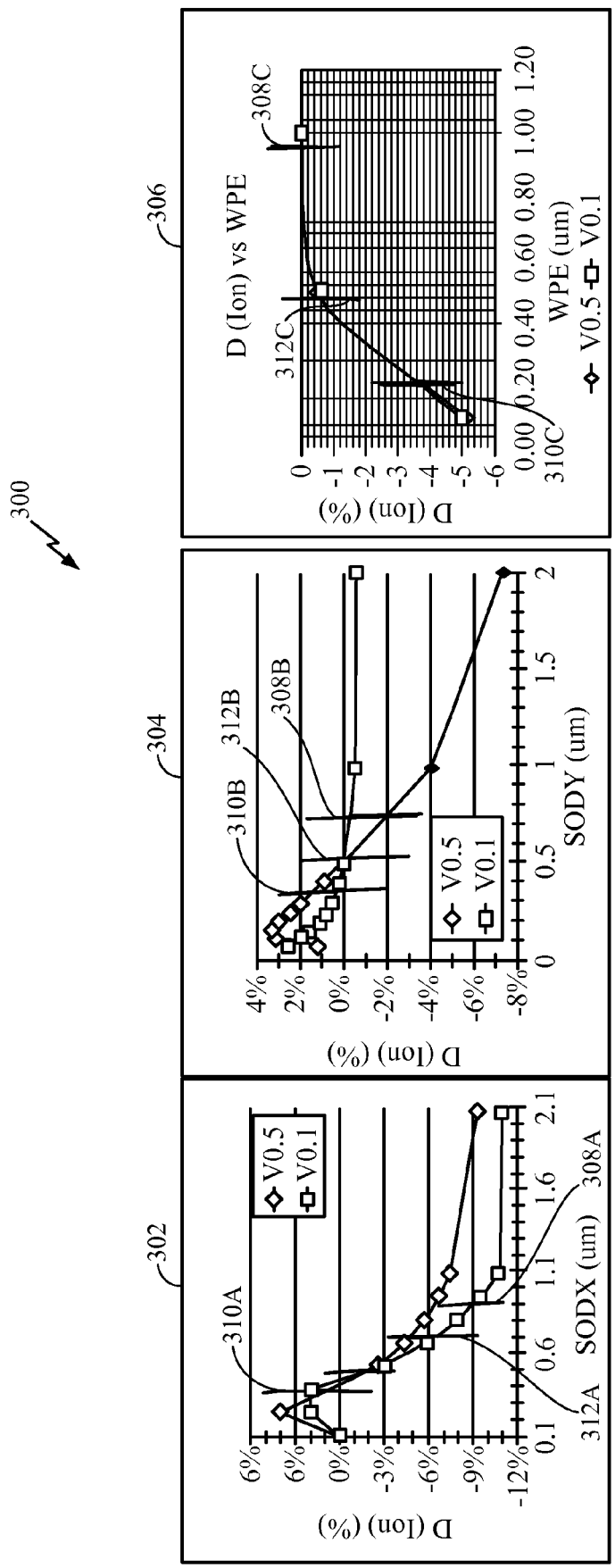
FIG. 3 shows a relation of an electrical characteristic of a standard cell with respect to each of three proximity context parameters selected according to one aspect.

The FIG. 3 example 300 shows one example set of observed delay characteristics, using the FIG. 2 device and proximity context model 200 and proximity context parameters SODX, SODY and WPE. The example 300 shows an example SODX versus delay characteristic 302, an example SODY versus delay characteristic 304, and an example WPE versus delay characteristic 306.

It will be understood, though, that methods according to one or more embodiments do not absolutely require that the proximity context versus time delay characteristic of the reference model be a database collected as described above. It is contemplated that methods according to these embodiments may, instead, be practiced using a given reference device model and a corresponding given set of proximity context versus time delay characteristics. It is further contemplated that methods according to one or more embodiments may be practiced by starting with a given generic reference device model and a given set of proximity context versus time delay characteristics for that generic reference device model, together with a given tweaking function that represents a known, or sufficiently estimated, relation between changes to the given generic reference device model and the corresponding changes to its proximity context versus time delay characteristics. The given generic reference device model may then be modified to a reference device model that more closely corresponds to devices forming the cells in a given cell library and, based on the given tweaking function, a usable set of proximity context versus time delay characteristics may be obtained.

Continuing in overview of one example method according to one embodiment, it will be assumed that there is a given target value for the timing spread of the cells in an IC design for which the method is being practiced. The target value may be an estimate, readily identified by persons of ordinary skill in the art based on factors such as the estimated device count, device geometry, general architecture, and target clock rate. It will also be understood that this overview is not limited to delay and timing spread. It will be understood and appreciated, instead, that this overview and the various practices and features described herein may be applied to given targets of other electrical characteristics that, for individual devices within an integrated circuit, are affected by the device's proximity context. Such electrical characteristics include, without limitation, proximity context versus current leakage, proximity context versus dynamic power, proximity context versus noise and/or proximity context versus I-V curve.

As previously described, it is assumed for this example that the actual IC will be designed with cells having devices corresponding to the reference device model. In the present example these would be NMOS and CMOS devices. Also, a database of the proximity context versus delay characteristics for the reference device model has been generated using, for example, the SODX, SODY and WPE parameters and simulation means as described above.

Continuing with one example method according to one or more embodiments, since the reference device model is assumed to represent a basic building block for the cells of the final IC design, a target minimum delay and a target maximum delay for the reference device model are identified, or estimated, based on that above-identified target timing spread. The estimation or identification goal of the target minimum delay and the target maximum delay may be as follows: if all cell proximity contexts in the final IC design are laid out using design constraints such that their timing delays cannot be outside the target minimum and target maximum delays, the final IC design will meet the target timing spread. A target average delay may also be identified, as will be later described in greater detail.

Further regarding an example estimating of a target timing spread for meeting a given IC performance, as will be understood by persons or ordinary skill, such estimating is independent of the means or capability for ascertaining whether the actual IC design will meet that target timing spread. In addition it will be understood that types of information having varying relevance to estimating the target timing spread for example the device count, device geometry and even the specific architecture may already be known, because example methods according to one or more embodiments may be used to scale an existing IC design down to a smaller geometry, or to complete, to a fabrication-ready design, a previously generated but not-yet-final design.

Next, a seed maximum reference proximity context and a seed minimum reference proximity context are selected, respectively, from the maximum N-dimensional contour and the minimum N-dimensional contour. For brevity, reference proximity contexts hereinafter generally referred to as "PLC, each defined by an N-tuple of proximity context parameter values.

As readily understood by persons of ordinary skill in the art having this disclosure, neither the maximum N-dimensional contour nor the minimum N-dimensional contour defines a unique PLC. On the contrary, to a user practicing one example method according to one embodiment, the maximum and minimum N-dimensional contour provide a range, namely the respective surfaces of the two contours, over which the user may select a seed maximum PLC and a seed minimum PLC, hereinafter referenced as the seed MAX PLC and seed MIN PLC, respectively. As will be described in greater detail at later sections, a validated MAX PLC and a validated MIN PLC, each obtained by an iterative process starting with their respective seed value, will be used to generate, for each cell in the library of cells intended for a given IC design, a maximum delay model and a minimum delay model.

As to selecting the specific seed MAX PLC and MIN PLC from the respective MAX and MIN N-dimensional contours, the selection may be, in part, a design choice, and as general guidelines may be points on these respective contours have a remarkable statistical likelihood of occurring. The statistical likelihood may be obtained, or estimated from, various test, inspection and analysis data accumulated from fabrication processes and device geometries similar to those of a given IC for which the method is being practiced.

Next, by applying design choice, conventional know-how, and example factors such as identified above, a seed MIN PLC and a seed MAX PLC are selected.

Referring to the FIG. 3, example values of SODX, SODY and WPE for one example seed MIN PLC are shown. The seed MIN PLC SODX value is shown as 308A on the example SODX versus delay characteristic 302, the seed MIN PLC SODY value as 308B on the example SODY versus delay characteristic 304, and the seed MIN PLC WPE value as 308C on the example WPE versus delay characteristic 306. Likewise, example values of SODX, SODY and WPE for one example seed MAX PLC are shown, as seed MAX PLC SODX value 310A on the example SODX versus delay characteristic 302, seed MAX PLC SODY value 310B on the example SODY versus delay characteristic 304, and seed MAX PLC value WPE 310C on the example WPE versus delay characteristic 306.

In one aspect, a seed target AVG PLC is also selected, based on the target timing spread. The seed target AVG PLC may be selected such that a target percentage of the actual proximity contexts in the final IC design will conform, to the seed AVG PLC. Referring to FIG. 3, an example set of SODX, SODY and WPE values for an example seed AVG PLC is shown. The seed AVG PLC SODX value is shown as 312A on the example SODX versus delay characteristic 302, the seed AVG PLC SODY value as 312B on the example SODY versus delay characteristic 304, and the seed MAX PLC value WPE as 312C on the example WPE versus delay characteristic 306. One example target percentage for actual proximity contexts to conform to the validated AVG PLC (which may be obtained iteratively from the seed AVG PLC) may be approximately 75%. Another example target percentage may be approximately 90%. In some instances a target percentage may be approximately 50%. In one aspect, described in greater detail at later sections, the validated AVG PLC may be used for further optimization of the IC layout by inspecting the average time delay of cells in a testing layout, as well as the distribution of time delays about that average, and modifying the layout design rules and constraints to change that distribution.

The examples described in reference to FIG. 3 are for an R value of three, i.e., using three different N-dimensional PLCs as the R different N-dimensional PLCs. Further to the described example having R as three, the example different PLCs are a MAX PLC, AVG PLC and MIN PLC. Methods according to one or more embodiments may use a different R, i.e., a different number of PLCs. In an example where R is three, using the MAX PLC, AVG PLC and MIN PLC example for illustration, using various testing layouts, as well as the final IC design, actual proximity contexts existing in these layouts will be characterized, based on the actual values of the proximity context's N (e.g., three) parameters as being one of the MAX PLC, AVG PLC and MIN PLC for the particular cell in that proximity context. Then, based on that characterization, the delay model of the proximity context is replaced by the delay value of the one of the cell's MAX PLC, AVG PLC and MIN PLC for which it was characterized. Stated differently, a three-value timing model is provided for each cell that will appear in a given IC design. In certain applications, though, a more than three-value timing model may be beneficial. For example, in certain applications it may be observed that proximity contexts among various IC designs are clustered, in terms of frequency of occurrence, about four distinct points in the N dimensional proximity context-defining space. In such an example, four different PLCs may be used, each corresponding to one of the four different clustering points.

Figure 4:
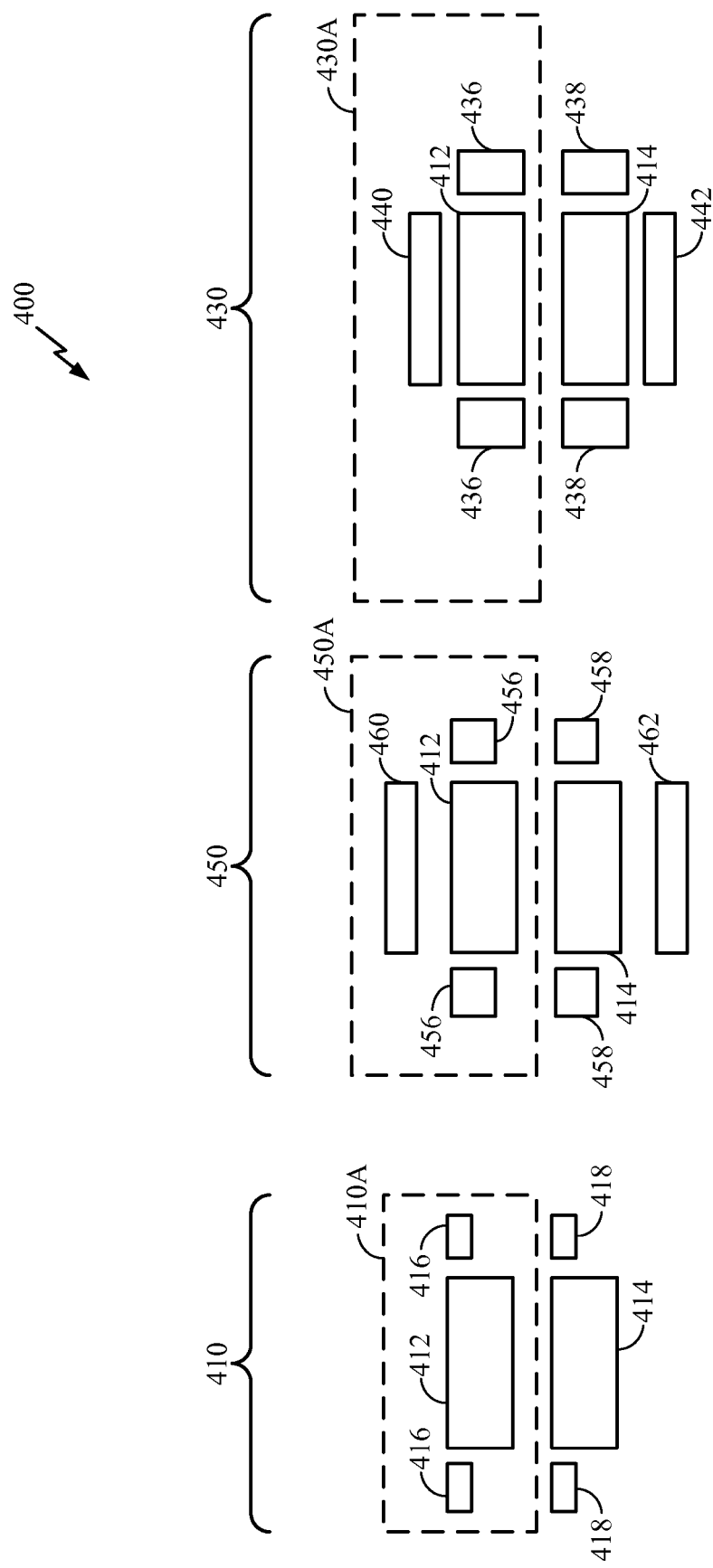
FIG. 4 shows one example set of seed proximity contexts, according to one aspect, for a given standard cell.

FIG. 4 shows a set 400 of an example MAX PLC 410, along with an example MIN PLC 430, and an example AVG PLC 450. The example MAX PLC 410, AVG PLC 450 and MIN PLC 430 each have a target device, shown as regions 412 and 414, in respectively different contexts. The different contexts include respective WPEs, shown as dotted boxes 410A, 430A and 450A, these having different respective values represented by the dotted boxes' different extension distances.

The MAX PLC 410, AVG PLC 450 and MIN PLC 430 contexts also represent random neighboring devices, for example as four neighboring rectangles. The FIG. 4 example depicts four neighboring rectangles, labeled 416 and 418 in the MAX PLC 410 context; labeled 456, 458 in the AVG PLC 450 context; and labeled 436, 438 in the MAX PLC context 430. Continuing to refer to FIG. 4, the MAX PLC 410, AVG PLC 450 and MIN PLC 430 contexts represent respective differences in the exposure of the side wall of the target device 412, 414 to these random neighboring cells by differences in the relation of the vertical height of the target device 412, 414 to the vertical height of the four neighboring rectangles. This may be referred to as "side protection" for the target device 412, 414. In the FIG. 4 example, the MAX PLC 410 has approximately 25% side protection, shown by the vertical height of the four neighboring rectangles 414, 416 being approximately 25% the vertical height of the target devices 412, 414. Likewise, the example AVG PLC 450 has approximately 50% side protection for the target device 412, 414, shown as the vertical height of the four neighboring rectangles 456, 458 being approximately 50% the vertical height of the 412, 414 target devices, while the example MIN PLC 430 has approximately 100% side protection, which is shown by the vertical height of the four neighboring rectangles 436, 438 being approximately 100% the vertical height of the target device 412, 414.

Referring still to FIG. 4, the MAX PLC 410, AVG PLC 450 and MIN PLC 430 contexts represent the existence and proximity of vertical neighbors to the target device 412, 414 as rectangular regions above and below the target device 412, 414. In the FIG. 4 example, the AVG PLC 450 has vertical neighbors represented as 460 and 462, spaced the depicted distance above the top edge of target device region 412, and the depicted distance below the bottom edge of the target device region 414. The example MIN PLC 430 has similar vertical neighbors 440 and 442, spaced respectively closer to the top edge of the target device region 412 and the bottom edge of the target device region 414. On the other hand, as seen in FIG. 4, in the example MAX PLC 410 the target device 412, 414 does not have any vertical neighbors.

Continuing with one example method according to one embodiment, after selecting the R different seed PLCs (e.g., MIN PLC, MAX PLC and AVG PLC) these may be validated, using a set of M reference cells taken, for example, from a given standard cell library. The M reference cells may include, or may not include, NAND, NOR, XOR, inverter cells, and "D" edge-triggered flip-flops. The specific number M is partly a design choice, readily made by persons of ordinary skill in the art based on this disclosure. As one illustrative example, and not to be understood as any characterization or limitation of the scope of the embodiments, M may be approximately fifty. Regarding the basis on which the M reference cells may be selected, M may be the most often used standard cells in the existing cell library. Various alternative bases for selection are contemplated, for example selecting the M reference cells based on estimating the cells that will be used most often in a particular IC design for which the method is being practiced. As one further alternative, the M reference cells may be the cells that are estimated, based on general information or on information regarding a specific IC design, as being the cells most often in a critical path. In still another alternative, given a cell library of S different cell models, instead of M being subset of the S cell models, M could be the entire set. Depending on the magnitude of S, and the computational resources available to the user, this may or may not be practical. Also, as will be understood by persons of ordinary skill in the art having this disclosure, selecting the entire set of S cell models may not provide a significant increase in the accuracy of timing spread estimation over what may be obtained using a value of M much smaller than S.

The validation of the R seed PLCs may begin by generating, for each of the M reference cells, N proximity context models, using the same proximity context parameters that defined the N PLCs obtained from the reference proximity context model. In the example described in reference to FIGS. 2 and 3, generating the R PLCs for each of the M reference cells generates, for each REFCELL(m), m=1 to M, three CONTEXT (REFCELL(m)), namely a MIN CONTEXT (REFCELL(m)), a MAX CONTEXT (REFCELL(m)), and AVG CONTEXT (REFCELL(m)). The generation of the MIN CONTEXT (REFCELL(m)), a MAX CONTEXT (REFCELL(m)), and AVG CONTEXT (REFCELL(m)), is by applying the N parameter values defining the seed MIN PLC, MAX PLC and AVG PLC, respectively, to the given cell model for REFCELL(m).

In the example described in reference to FIGS. 2 and 3 generating the R PLCs for each of the M reference cells may be performed by generating three modified forms of each REFCELL(m) model, one being the REFCELL(m) model modified to conform to the three-tuple (SODX, SODY and WPE) that defines seed MIN PLC, one being the REFCELL (m) model modified to conform to the three-tuple (SODX, SODY and WPE) that defines the seed MAX PLC, and one being the REFCELL(m) model modified to conform to the three-tuple (SODX, SODY and WPE) that defines the seed average PLC. To illustrate, each MIN CONTEXT (REFCELL(m)) may be generated by modifying the REFCELL (m) so that its SODX, SODY and WPE parameter values conform to the seed MIN SODX, seed MIN SODY and seed WPE values that define the seed PLC.

Next, for each of the M reference cells a delay is calculated for each of its R different proximity context models. In an example where N is three, and the three different reference proximity contexts are MIN PLC, MAX PLC and AVG PLC, the delay calculation may generate a MIN, MAX and AVG time delay for each of the M reference cells. The time delays may be calculated using, for example, a simulation tool such as HSPICE or another simulation tool. Referring to the example PLCs of MIN, MAX and AVG described in reference to FIG. 3, for each REFCELL(m), a MIN DELAY (REFCELL(m)) is calculated for the MIN CONTEXT (REFCELL (m)), a MAX DELAY (REFCELL(m)) is calculated for the MAX CONTEXT (REFCELL(m)) and an AVG DELAY (REFCELL(m)) is calculated for the MIN CONTEXT (REFCELL(m)).

Based on the calculations described above, for each REFCELL(m) three time delays are calculated, which may be represented as MIN DELAY (REFCELL(m)), MAX DELAY (REFCELL(m)) and AVG DELAY (REFCELL(m)). Stated more generally, for each REFCELL(m) R delays are calculated, generating an R-tuple of delay values. This R-tuple of delay values for each REFCELL(m) may be referred to as the discrete characterized delay model of REFCELL(m) or, for brevity, "DCD model of REFCELL(m)." Referring to the example MIN PLC, MAX PLC and AVG PLC described in reference to FIGS. 2, 3, and 4, each DCD model of REFCELL (m) is a three-tuple of: MIN DELAY (REFCELL(m)), MAX DELAY (REFCELL(m)) and AVG DELAY (REFCELL(m)).

Continuing with an example validation of the seed PLCs, in one example each of the M reference cells is placed in a layout in which the M reference cells are in various proximity contexts with other cells of the cell library. The layout of the reference cells is subject to the above-identified starting set of design constraints.

Preferably, to ensure the layout of the reference cells produces all proximity contexts that may appear in a given IC design, the layout of the M different reference cells is random, such that the layout produces, for every one of the M reference cells, every possible proximity context in which that reference cell may appear. It will be understood that generating every possible proximity context may not, in all circumstances, be a strict, absolute requirement. Instead, as will be readily understood by persons of ordinary skill in the art in view of this disclosure, a layout of the reference cells may be used in which at least some possible proximity contexts are omitted. It will also be understood by such persons that such omissions of proximity contexts may result in estimation results having degraded accuracy.

Continuing in reference to the example validation, the timing spread and worst-case timing value for each of the proximity contexts in the layout of the reference cells is then calculated using, for example, a conventional simulation tool such as HSPICE. The generated timing spread may be referenced as the "timing accuracy standard," as it will used to determine whether the seed PLCs, e.g., the seed MIN PLC, MAX PLC and AVG PLC, require change, as will be described in greater detail. The description hereinafter assumes that the timing layout included all of the M reference cells, and all possible proximity contexts of each. However, it will be understood that the description generally applies even if the layout of reference cells omitted certain ones of the M reference cells.

Either before or after generating the timing accuracy standard by, for example, HSPICE timing analysis of the layout of reference cells, each of the reference cell proximity contexts resulting from the above-described layout of the M reference cells is then characterized as being one of the N proximity contexts previously generated for that specific reference cell proximity context. For each of the reference cell proximity contexts in the testing layout, the identity as to which of the M reference cells is in that proximity context is known from the layout information (e.g., netlist). The characterization therefore looks at the R different proximity contexts previously generated for that specific reference cell and characterizes, or classifies it as one of those R proximity contexts, based on one or more classification criteria. The particular classification criteria are a design choice, readily determined by persons of ordinary skill in view of this disclosure.

As an illustrative example, if R is three, and the three reference cell proximity contexts are those exhibiting MIN, MAX and AVG delay, each reference cell proximity context in the layout of reference cells will be characterized, based on given classification criteria, as one from among MIN CONTEXT (REFCELL(m)), MAX CONTEXT (REFCELL(m)) and AVG CONTEXT (REFCELL(m)). Which of the "R" different sets of three proximity contexts is known, because "m" is known from the generated layout information.

Next, when characterization of each reference cell proximity context in the layout of reference cells is complete, the specific time delay of the proximity context model identified by that characterization is substituted for the time delay that the simulation tool calculated for that reference cell proximity context in the same layout. Stated differently, for each instance of a reference cell proximity context in the layout of reference cells, a specific one of the R delay values in the DCD model of REFCELL(m) is substituted for the delay calculated by the simulation tool calculated time delay. The resulting model of the layout of reference cells may be referenced as the "discrete proximity context timing model." A timing analysis is then performed on the discrete proximity context timing model using, for example, the same simulation tool (e.g., HSPICE) as may be used to generate the timing accuracy standard described above.

The timing spread calculated using the timing values of the reference cell substituted for the actual cell are then compared to the timing accuracy standard. If the timing spread calculated using the seed PLCs (e.g. seed MIN PLC, seed AVG PLC and seed MAX PLC) does not compare, within the given quality criterion, with the timings obtained through HSPICE or equivalent simulation, then one or more of the seed PLCs, (e.g., one or more of MIN PLC, AVG PLC and MAX PLC) may be revised. Corresponding to revising the seed PLCs, the design constraints for the IC may be changed (e.g., tightened) such that the layout is within the bounds defined by the PLCs. Using the example PLC set of MIN PLC, AVG PLC and MAX PLC, a new set of MIN CONTEXT (REFCELL(m)), MAX CONTEXT (REFCELL(m)) and AVG CONTEXT (REFCELL(m)) is then generated. A new layout of reference cells is generated, and each of the reference cell proximity contexts in that testing layout is characterized according to the revised MIN CONTEXT (REFCELL(m)), MAX CONTEXT (REFCELL(m)) and AVG CONTEXT (REFCELL(m)), to generate a new discrete proximity context timing model. The timing spread obtained using the new discrete proximity context timing model is compared with the timing accuracy standard. These iterations are repeated until the timing calculated using the revised MIN PLC, AVG PLC and MAX PLC compares, within the given quality criterion, to the timings obtained through HSPICE or equivalent simulation. The last updated set of MIN PLC, AVG PLC and MAX PLC becomes the validated MIN PLC, AVG PLC and MAX PLC.

Next, based on the validated reference PLCs (e.g., MIN PLC, AVG PLC and MAX PLC), for each cell of the entire set of S cells intended for use in the IC a MIN CONTEXT (CELL(s)), AVG CONTEXT (CELL(s)) and MAX CONTEXT (CELL(s)), for s=1 to S. The IC is then designed, using the last updated design constraints, each proximity context of each cell is characterized as one of the cell's MIN CONTEXT (CELL(m)), MAX CONTEXT (REFCELL(m)) and AVG CONTEXT (REFCELL(m))MIN PLC, AVG PLC and MAX PLC and, lastly, the timing spread and current leakage is then estimated from the cell's MIN PLC, AVG PLC and MAX PLC.

The above-described examples of one method according to one or more embodiments illustrate various fundamental concepts of the embodiments. Practice according to one or more embodiments, however, is not limited to the depicted examples.

For example, in one aspect the SODX parameter may be based only on the spacing 210 from the right edge 202A of the active region 202 of the generic cell 201 to the left edge 204A of the neighboring active region 204. In another aspect the SODX parameter may be weighting of the distance 210 by the horizontal distance 210A from the right edge 202A to a diffusion position 212 of the right neighbor.

The example methods according to embodiment, as described above, provide a computationally efficient, and accurate, timing and current leakage estimation. The accuracy is contemplated as being close, within a readily estimated error, to the timing and current leakage estimation obtainable through exhaustive proximity context simulation. It will be understood and appreciated that the example methods according to embodiment, as described above, also provide a computationally efficient, and accurate, estimation of other electrical characteristics such as, without limitation, dynamic power, noise and I-V curve. Also, it is contemplated that the accuracy of estimations of dynamic power, noise and I-V curve that are obtainable through practices according to the various embodiments will be close, within a readily estimated error, to the dynamic power, noise and I-V curve estimation obtainable through exhaustive proximity context simulation.

In another aspect, by characterizing instances of each cell in an actual layout of an IC as one of the R different reference proximity contexts, a bin, a timing spread may be very rapidly obtained. For example, assuming three reference proximity contexts of MIN PLC, AVG PLC and MAX PLC, a design tool generated layout of an IC having one million cells can be very rapidly modeled as a discrete proximity context model, by a simple comparison-based characterization of each of the one million cells, i.e., for s=1 to 1,000,000 as one of its MIN CELL(s), AVG CELL(s) MAX CELL(s) proximity contexts. Each of the cells in the layout is then modeled as having a time delay, specified by its classification among its three proximity contexts, equal to one of DELAY MIN CELL(s), DELAY AVG CELL(s) or DELAY MAX CELL(s). A timing spread can then be very rapidly generated for the discrete proximity context model. A bin distribution of a general form as shown at FIG. 1 is then generated. Viewing such a bin distribution, a user can quickly valuate the cost versus benefit of making various changes to the design constraints, as well as changes to the standard cells themselves, to reduce, or eliminate outlier instances.

As one further example, with respect to design constraints, a user may introduce various candidate margins, and/or stress shielding features (e.g., filling most of the empty OD holes inside all cells), into certain of the cells and rapidly evaluate each, using the computationally efficient timing spread analysis provided by these embodiments. As can be seen by a person of ordinary skill in the art having this disclosure, the evaluation of such candidate margins simply requires generating an updated MIN PLC, MAX PLC and AVG PLC for the cells into which the candidate margins have been introduced. Then, a new IC layout is generated using the specific candidate margins, and the proximity contexts of the new IC layout are re-characterized according to the updated MIN PLC, MAX PLC and AVG PLC. Then, based on that re-characterization, the timing spread and, if desired, the current leakage of each cell is estimated. Example stress shielding features include positioning edge devices.

Figure 5:
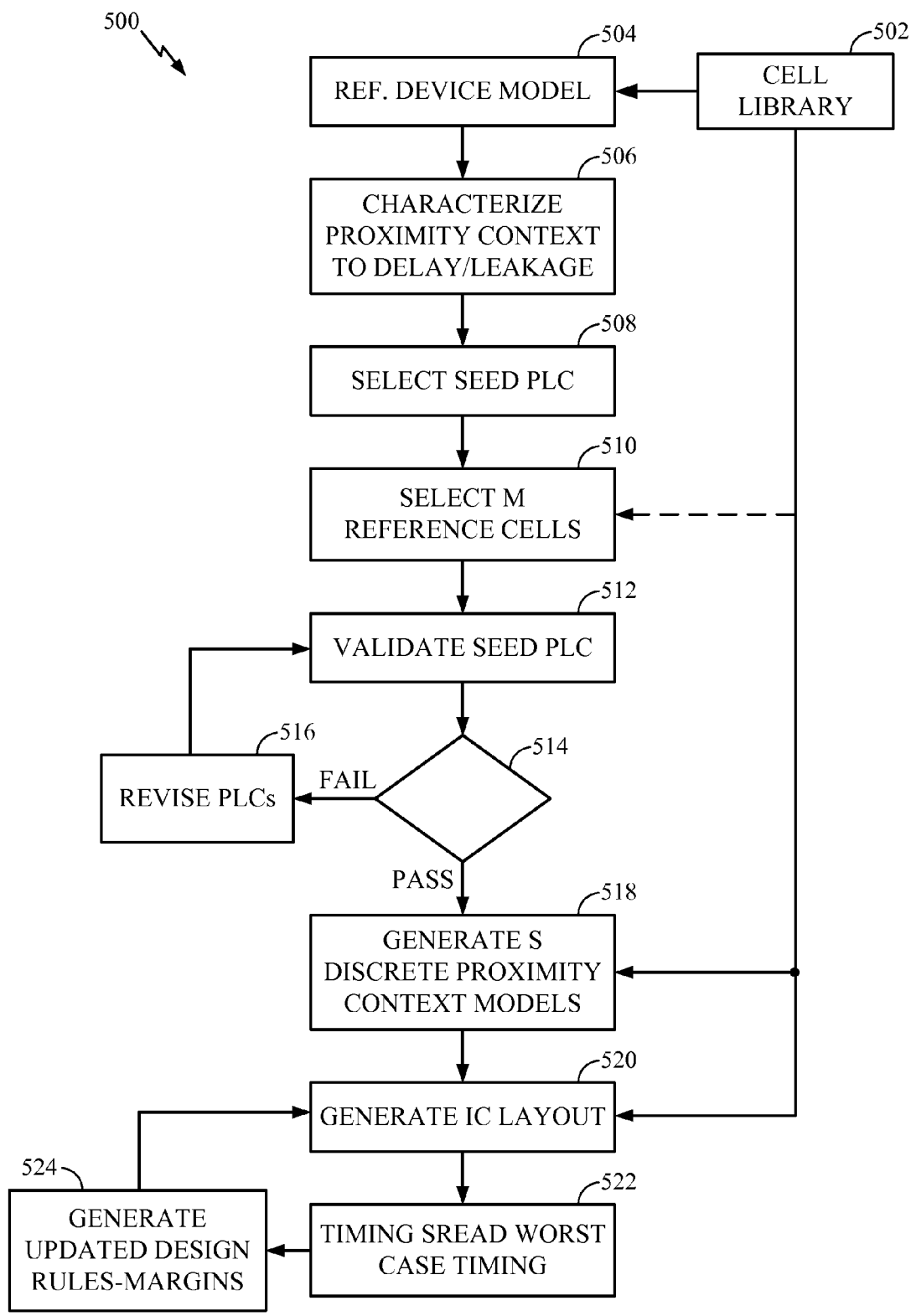
FIG. 5 shows a function flow of one method for generating an IC reference cell proximity context model according to one embodiment.

FIG. 5 shows a function flow 500 of an example design process using methods according to one or more embodiments. First, at 502 a cell library is provided. The cell library may be a conventionally generated cell library, having a plurality of S different specific cells. The value of S is not relevant but, as one example, may range anywhere from approximately fifty to several thousands. Next at 504 a reference proximity context model is provided, preferably having device models and a format compatible with the reference cell library. Next, at 506 the proximity context versus electrical characteristic for the reference proximity context model is obtained. As previously described, the electrical characteristic may be delay, may be current leakage, may be dynamic power, noise and/or I-V curve. The characterization is according to N parameters of an N-dimensional proximity context space in which the reference proximity context model is defined. One example is SODX, SODY and WPE, as previously described.

At 508 R different seed PLCs are selected, based on a given target timing spread. In one example the R PLCs may be a MIN PLC, MAX PLC and AVG PLC. At 510 a set of M reference cells is selected, with M being, for example, a subset of S. Other selections of M and, example guidelines for selecting the types of cells for the M reference cells are previously described. Next, at 512 the seed PLCs may be verified as previously described by, for example, comparing a timing spread obtained from a discrete context timing model, obtained using the seed PLCs, to a timing spread calculated for the original testing layout by, for example, a simulation tool. It will be understood, in applications of the various embodiments in modeling and estimating electrical characteristics other than timing, that the verification at 512 may be performed by, for example, comparing a current leakage, dynamic power, or noise characteristic obtained from a discrete context based current leakage, dynamic power, or noise model, obtained using the seed PLCs, to a current leakage, dynamic power, or noise model calculated for the original testing layout by, for example, a simulation tool. The verification at 512 may generate a pass/fail result. A functional flow 600 of one example verification 512 is described later in reference to FIG. 6.

Still referring to FIG. 5, at decision block 514, if the verification result from 512 indicates failure, the process goes 516 to update the seed PLCs, in a direction that may be estimated as bringing the timing closer to the timing accuracy standard, and then back to 512 to repeat the verification. If the verification performed at 512 indicates success, the R PLCs are set as validated PLCs, and the process goes to 518. At 518 the process generates, for every one of the S cells in the cell library, R different proximity context models. It will be understood that if the set of M reference cells selected at 510 included all S of the library cells then step 518 may be omitted.

If the validation at 512 indicates failure, i.e., the timing calculated using the discrete proximity context timing model does not compare, within a given quality criterion, with the timing accuracy standard then, one or more of the seed R PLCs, e.g., the seed MIN PLC, seed AVG PLC and seed MAX PLC is revised. The validation 512 is then repeated, and these iterations are repeated until the timing calculated using the updated R PLCs, e.g., updated MIN PLC, AVG PLC and MAX PLC, compares, within the given quality criterion, to the timing accuracy standard.

With continuing reference to FIG. 5, upon validation of the R PLCs, at 518 a set of R discrete proximity context models is generated for S of the cells in the cell library 502, which may be every one of the cells. Next, at 520 the IC design is generated, using the design constraints corresponding to the final set of reference proximity contexts (e.g., on the final values of MIN PLC, MAX PLC and AVG PLC. At 522 the timing spread and worst case timing of the completed design is evaluated. Block 522 may be performed using the same process previously described, namely characterizing each cell context in the completed design as one of the set of R discrete proximity context models, using the described comparing or classification, substituting the modeled time delay value for the cell context to generate a characterized discrete timing model for the IC, and then performing a timing analysis. The process is also described below in reference to FIG. 6 for validating the R different PLCs.

In one aspect, as shown by FIG. 5 block 524 and described previously, based on the characterized discrete timing model for the IC obtained block 522, a user may evaluate various changes to the design constraints, as well as changes to the standard cells themselves, to reduce or eliminate outlier delays, or to otherwise change the timing spread, by iterating cycles of 520, 522 and 524.

As one further example, with respect to design constraints, a user may introduce various candidate margins, and/or stress shielding features.

Figure 6:
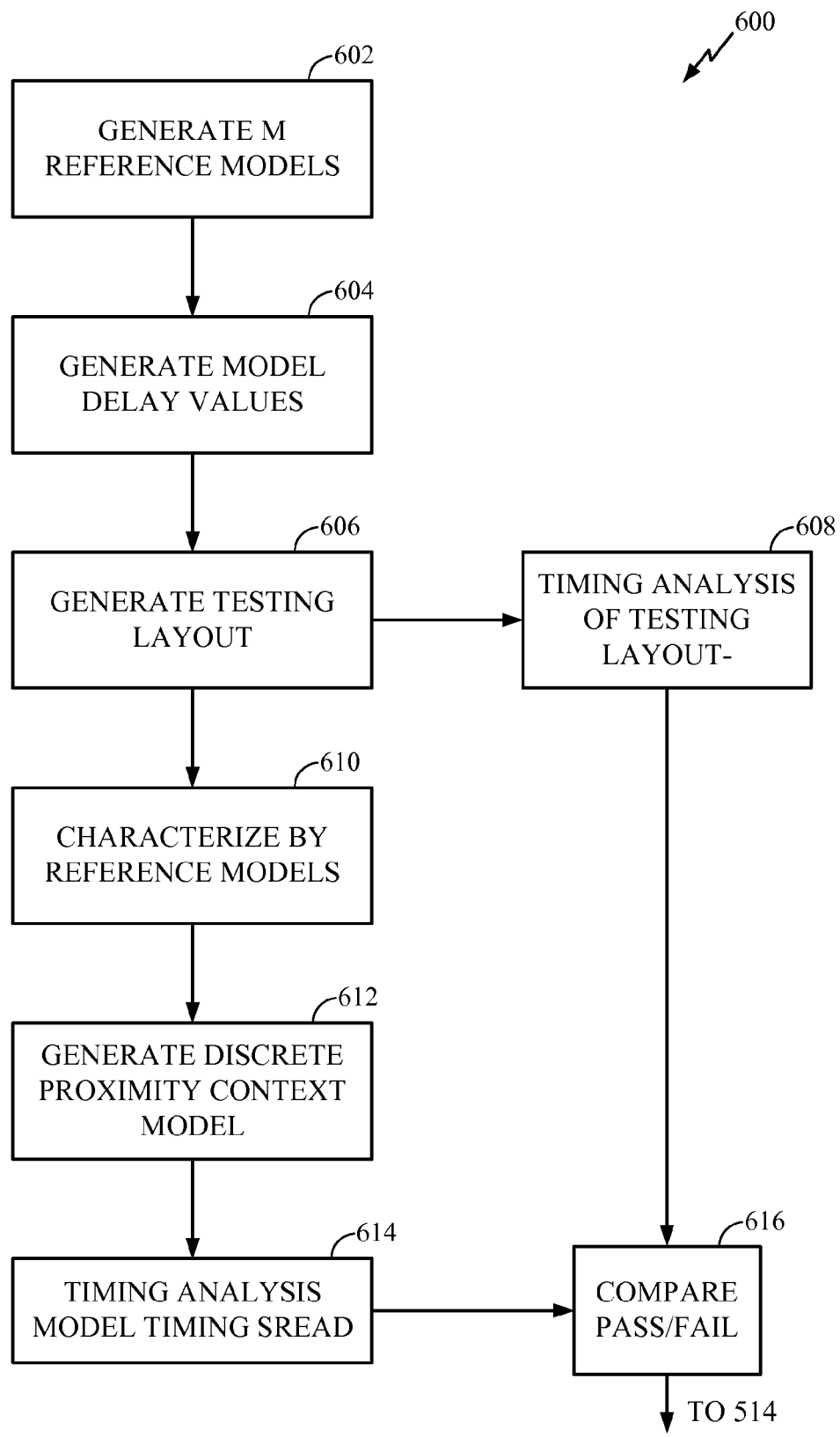
FIG. 6 shows an example validation of reference proximity contexts in the FIG. 5 flow.

FIG. 6 shows a detailed functional flow 600 of one example for carrying out the verifying 512 of the FIG. 5 example flow 500.

The example 600 may begin at block 602 which generates R proximity context models for each of the M reference cells, i.e., for REFCELL(m), m=1 to M, using either the seed value for each of the R different reference proximity contexts selected at 508 of the FIG. 5 example flow 500, or an updated set of R different reference proximity contexts generated by a previous iteration of the FIG. 5 flow 500. In the example described in reference to FIGS. 2, 3 and 4, block 602 may generate MIN CONTEXT (REFCELL(m)), MAX CONTEXT (REFCELL(m)), and AVG CONTEXT (REFCELL(m)), for each REFCELL(m). Next, at 604, for each of the M reference cells a delay is calculated for each of its R different proximity context models. In other words, a set of M R-tuples is generated—one for each proximity context. Each R-tuple may be referred to as the "discrete proximity context delay" of "DCD" of REFCELL(m). In the example described in reference to FIGS. 2, 3 and 4, block 604 may generate, for m=1 to M, MIN DELAY (REFCELL(m)), MAX DELAY (REFCELL(m)), and AVG DELAY (REFCELL(m)), which is the DCD model of REFCELL(m).

With continuing reference to FIG. 6, block 606 then generates a testing layout, which places each of the M reference cells in various proximity contexts with other cells of the cell library. The testing layout is generated using a starting set of design constraints dictated, at least in part, on the seed RFCs selected at block 508 of the FIG. 5 flow 500. Next, at 608, a timing accuracy standard, against which a timing spread calculated using the current set of PLCs will be compared, is generated. The 608 block may be carried out by, for example, applying a simulation tool, such as HSPICE, to the testing layout generated at 606 to generate a timing spread and worst-case time value for each of these proximity contexts in the testing layout, and then assigning these values as the timing accuracy standard for use in the instant iteration through the FIG. 6 flow 600.

Referring still to FIG. 6, at 610, in no particular order relative to 608, each of the reference cell proximity contexts in the testing layout generated at 606 is characterized, e.g., classified based on a comparison and a classification rule, as one of the current R discrete proximity contexts for that reference proximity context. Based on the characterization, a DCD model of REFCELL(m) is assigned to the proximity context. At 612 a characterized discrete timing model for the testing layout is generated, by each substituting each instance of a reference cell proximity context in the testing layout with the specific one of the R delay values in the DCD model of REFCELL(m) corresponding to which of the R different proximity contexts that it was classified. It will be understood that 612 may be performed concurrently with, or incorporated into 610.

Next, at 614, a timing analysis is performed on the discrete proximity context timing model to generate a timing spread and worst-case time value using, for example, the same simulation tool (e.g., HSPICE) that was used to generate the timing accuracy standard. At 616, a pass/fail is generated, based on a comparing of the timing spread calculated at 614 using the characterized discrete timing model obtained at 612 to the timing accuracy standard generated at 608. The pass/fail result is then passed to the FIG. 5 block 514.

Optionally, results of the timing spread and worst case time value may be used, prior to proceeding to the FIG. 5 block 514, to tighten the design rules, and even evaluate introducing margins and stress protection means into certain of the M reference cells. Examples of such evaluation, performing timing analysis of complete IC designs using a characterized discrete timing model of one or more embodiments, are described in greater detail at later sections.

The above-described generation of M reference cells a delay is calculated for each of its R different proximity context models R different cell device discrete proximity context model for, for MIN DELAY (REFCELL(m)), MAX DELAY (REFCELL(m)), and AVG DELAY (REFCELL(m)), does not explicitly reference the process-voltage-timing (PVT) corners at which MIN DELAY (REFCELL(m)), MAX DELAY (REFCELL(m)), and AVG DELAY (REFCELL(m)) were obtained.

In one aspect, all of MIN DELAY (REFCELL(m)), MAX DELAY (REFCELL(m)), and AVG DELAY (REFCELL(m)) may be obtained at the same PVT corner.

In another aspect, the MAX DELAY (REFCELL(m)), m=1 to M, may be obtained at the slowest PVT under which the IC is intended to operate. The resulting delay model, for this slowest model of each proximity context, may be MAX DELAY/SLOWEST PVT (REFCELL(m)). Further to the aspect, AVG DELAY (REFCELL(m)), m=1 to M, may be obtained at an average PVT under which the IC is intended to operate. The resulting delay model, for this average model of each proximity context, may be AVG DELAY/AVG PVT (REFCELL(m)). Likewise, MIN DELAY (REFCELL(m)), m=1 to M may be obtained at the fastest PVT under which the IC is intended to operate, to generate MIN DELAY/FASTEST PVT (REFCELL(m)).

It will be understood that the above-described PVT corner aspect may be applied for modeling and estimation of electrical characteristics other than delay. For example, for current leakage, a MAX LEAKAGE (REFCELL(m)), m=1 to M, may be obtained at the highest current leakage PVT under which the IC is intended to operate. The resulting current leakage model, for this highest current leakage model of each proximity context, may be MAX LEAKAGE/HIGHEST LEAKAGE PVT (REFCELL(m)). Further to the aspect, AVG LEAKAGE (REFCELL(m)), m=1 to M, may be obtained at an average PVT under which the IC is intended to operate. The resulting leakage model, for this average model of each proximity context, may be AVG LEAKAGE/AVG PVT (REFCELL(m)). Likewise, MIN LEAKAGE (REFCELL(m)), m=1 to M may be obtained at the lowest leakage PVT under which the IC is intended to operate, to generate MIN LEAKAGE/LOWEST PVT (REFCELL(m)). It will be readily appreciated that the same PVT corner aspect may be practiced for other proximity based characteristics, for example dynamic power, noise, and I-V curve.

Figure 7:
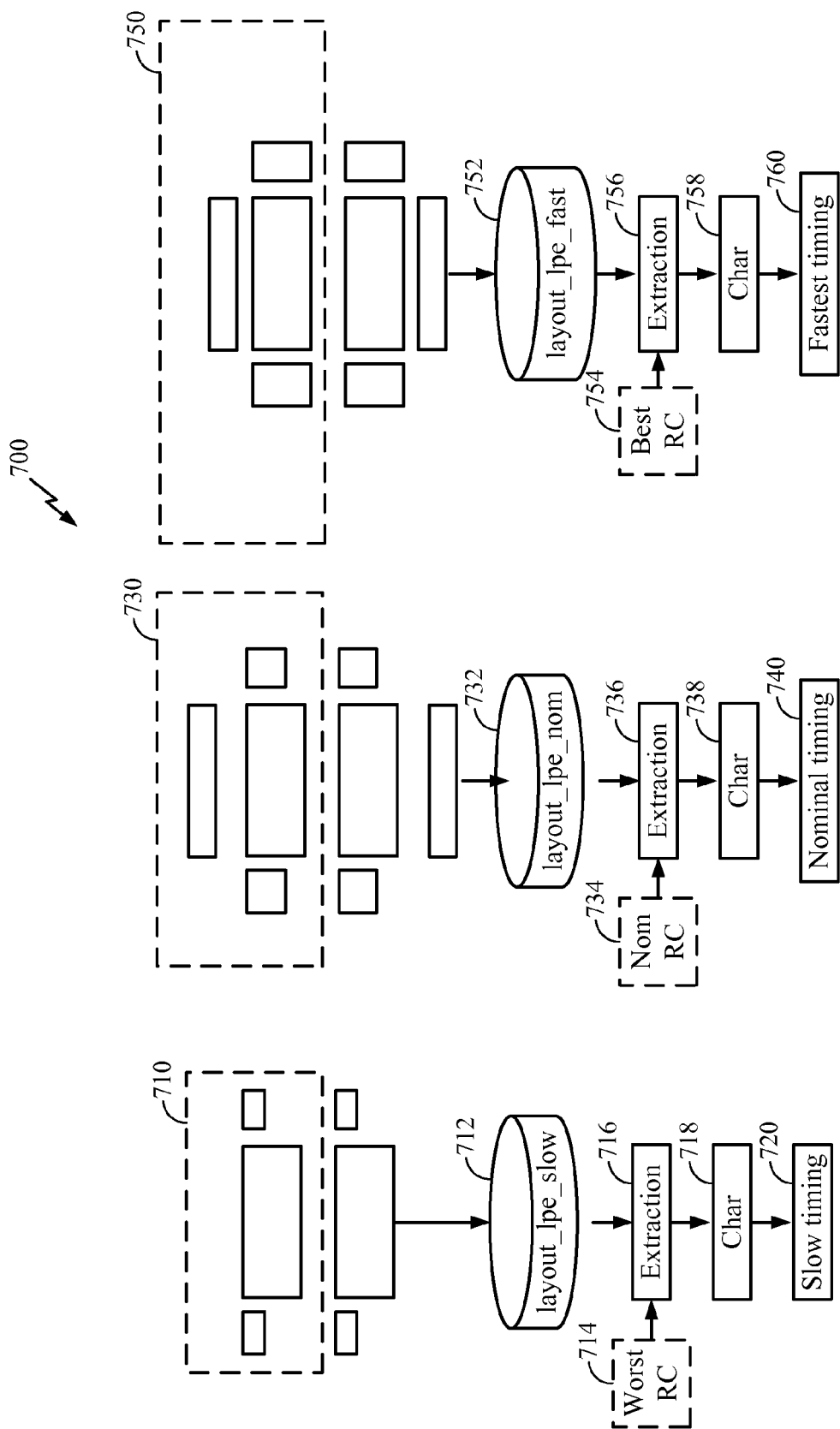
FIG. 7 shows a function flow of one method for generating discrete proximity context models to meet a given set of PVT corners, according to one embodiment.

FIG. 7 illustrates one example flow 700 according to this aspect, using the example set of reference cell proximity contexts of MAX PLC, AVG PLC and MIN PLC. The example flow 700 may begin at 710 with the MAX PLC and then go to 712 to generate a MAX delay proximity context model for all of the cells in a given cell library. Assuming a cell library of S cells, block 712 generates a MAX delay proximity context model for each of the S cells. The example flow 700 may then go to 716 to perform circuit extraction on each of the S MAX delay proximity context models, using a worst RC value provided at 714 that models, using slow RC (i.e., slow rise time) approximation for a worst case PVT corner under which one or more ICs are intended to operate. Next, at 718 the time delay is characterized for each of the S MAX delay proximity context models to generate at 720 a set of S slowest proximity context, worst case PVT corner time delays.

Continuing with FIG. 7, the flow 700 starting at 730 may proceed substantially identical to the flow that started at 710. More specifically stated, starting at 730 with the AVG PLC, the flow goes 732 to generate an AVG delay proximity context model for each of the S cells. The example flow 700 may then go to 736 to perform circuit extraction on each of the S AVG delay proximity context models, using an average RC value provided at 734 that models, using an average RC approximation for an average PVT corner under which one or more ICs are intended to operate. At 738 the time delay is characterized for each of the S AVG delay proximity context models to generate at 740 a set of S average proximity context, average case PVT corner time delays.

Referring still to FIG. 7, the flow starting at 750 may also proceed substantially identical to the flow that started at 710. More specifically starting at 750 with the MIN PLC, the flow goes 752 to generate a MIN delay proximity context model for each of the S cells, and then go to 756 to perform circuit extraction on each of these S MIN delay proximity context models, using an fast RC value provided at 754 that models, the fastest PVT corner under which one or more ICs are intended to operate. At 758 the time delay is characterized for each of the S MIN delay proximity context models to generate at 760 a set of S MIN proximity context, fastest case PVT corner time delays.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying methods, or features of methods according to one or more embodiments. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for computer modeling electrical characteristics of integrated circuit cells having given circuit elements, comprising:
    determining a relationship between a proximity context of a reference circuit element and an electrical characteristic of the reference circuit element;
    generating, for at least one of the cells, a plurality of cell proximity context models, based on a given model of the cell, the electrical characteristic, and the determined relationship;
    generating a cell layout having at least one instance of the at least one cell;
    characterizing at least one instance of the at least one cell in said cell layout, based on a value of a given structural parameter of said at least one cell, as one of a plurality of cell proximity context models associated with said cell; and
    generating a characterized discrete electrical characteristic model of the cell layout by substituting said instance of the least one cell by a value of an electrical characteristic of a cell proximity context model obtained as a result of the characterizing as characterizing,
    wherein at least one of said determining a relationship, said generating a plurality of cell proximity context models, said generating a cell layout, said characterizing at least one instance of the at least one instance of the cell, and said generating a characterized discrete electrical characteristic model of the cell layout is performed by a processor in accordance with instructions stored in a computer-readable storage medium coupled to the processor.

2. The method of claim 1 for computer modeling electrical characteristics of integrated circuit cells having given circuit elements, wherein the proximity context of the reference circuit element is represented as a N-dimensional proximity context vector representing N physical parameters of the proximity context.

3. The method of claim 1 for computer modeling electrical characteristics of integrated circuit cells having given circuit elements, wherein generating a plurality of cell proximity context models includes:
    selecting a plurality of reference proximity contexts based on the determined relationship and a plurality of given values of the at least one electrical characteristic; and
    generating the plurality of cell proximity context models based on a given model of the cell and the plurality of reference proximity contexts,
    wherein said selecting a plurality of reference proximity contexts selects, based on a target electrical characteristic value, R different reference proximity contexts, including a minimum reference proximity context, an average reference proximity context, and a maximum reference proximity context.

4. The method of claim 1 for computer modeling electrical characteristics of integrated circuit cells having given circuit elements, further comprising generating, for each of the plurality of cell proximity context models, a corresponding plurality of modeled electrical characteristic values, wherein said generating includes performing an electrical characteristic analysis on each of the plurality of cell proximity context models, wherein a characterized discrete electrical characteristic model of the layout generated includes a modeled electrical characteristic value of a cell proximity context model, a result obtained in the characterizing.

5. The method of claim 1 for computer modeling electrical characteristics of integrated circuit cells having given circuit elements, wherein said generating a plurality of cell proximity context models includes:
   selecting a plurality of reference proximity contexts based on the determined relationship and at least one given electrical characteristic value; and
   generating the plurality of cell proximity context models based on a given model of the cell and the plurality of reference proximity contexts,
   wherein the electrical characteristic is a time delay, the method further comprising:
   generating, for each of the plurality of reference proximity contexts, a corresponding plurality of modeled time delay values, by performing an electrical characteristic analysis on each of the plurality of reference proximity contexts, wherein a characterized discrete electrical characteristic model of the cell layout includes a modeled time delay value of a cell proximity context model that is a result obtained in the characterizing.

6. The method of claim 1 for computer modeling electrical characteristics of integrated circuit cells having given circuit elements, wherein said generating a plurality of cell proximity context models includes:
   selecting a plurality of reference proximity contexts based on the determined relationship and at least one given electrical characteristic value; and
   generating the plurality of cell proximity context models based on a given model of the cell and the plurality of reference proximity contexts,
   wherein the selected plurality of reference proximity contexts are a plurality of seed reference proximity contexts, and the method further comprises verifying the plurality of seed reference proximity contexts, wherein said verifying comprises:
   generating, for each of a plurality of given reference cells, a plurality of reference cell proximity contexts, based on a given model of the reference cell and the plurality of seed reference proximity contexts;
   generating, for each of the given reference cells having a plurality of reference cell proximity contexts, a corresponding plurality of modeled reference electrical characteristic values;
   generating a layout of a set M of cells, having at least one instance of reference cells among the plurality of given reference cells;
   performing an electrical characteristic analysis on instances of reference cells in the set M and generating a corresponding reference standard electrical characteristic;
   characterizing the reference cell at each of a plurality of instances of reference cells in the set M as one of a plurality of reference cell proximity contexts generated from said reference cell, based on a value of a given structural parameter of said reference cell;
   generating a characterized discrete model of all elements of the set M by substituting the instances of reference cells in the layout of the set M with the modeled electrical characteristic value of the reference cell's characterized reference proximity context;
   performing an electrical characteristic analysis on a discrete context model to generate a test electrical characteristic analysis; and
   generating a success/failure verification result based on a comparison of the test electrical characteristic analysis and the reference standard electrical characteristic.

7. The method of claim 6 for computer modeling electrical characteristics of integrated circuit cells having given circuit elements, further comprising:
   setting the seed reference proximity contexts as the reference proximity contexts if the success/failure verification result indicates success; else
   updating of the seed reference proximity contexts and repeating said verifying.

8. The method of claim 1 for computer modeling electrical characteristics of integrated circuit cells having given circuit elements, wherein generating the plurality of cell proximity context models includes:
   selecting a plurality of reference proximity contexts based on the determined relationship and the at least one given electrical characteristic value; and
   said generating a plurality of cell proximity context models based on a given model of the cell and the plurality of reference proximity contexts, the method further comprising: updating a given design tool constraint based on the selected plurality of reference proximity contexts, wherein generating a testing layout generates the cell layout based on the updated given design tool constraint,
   wherein said updating a given design tool constraint comprises updating design tool instructions stored in a computer readable storage medium coupled to a processor, and
   wherein said generating a testing layout includes the processor executing the updated design tool instructions.

9. The method of claim 1 for computer modeling electrical characteristics of integrated circuit cells having given circuit elements, wherein determining the relationship between a proximity context of a reference circuit element and an electrical characteristic of the reference circuit element includes generating a model of the reference circuit element in a proximity context defined by a plurality of structural parameters, iteratively varying at least one of the structural parameters over a given range and, at each iteration, performing an analysis to generate, by a plurality of the iterations, a proximity context versus electrical characteristic for the reference circuit element, and wherein the determined relationship is based on the proximity context versus electrical characteristic.

10. The method of claim 1 for computer modeling electrical characteristics of integrated circuit cells having given circuit elements, wherein the electrical characteristic is a time delay characteristic, wherein said determining a relationship between a proximity context of a reference circuit element and the time delay characteristic of the reference circuit element includes generating a model of the reference circuit element in a proximity context defined by a plurality of structural parameters, iteratively varying at least one of the structural parameters over a given range and, at each iteration, performing a timing analysis to generate, by a plurality of the iterations, a proximity context versus time delay characteristic for the reference circuit element, and wherein the determined relationship is based on the proximity context versus time delay characteristic.

11. The method of claim 1 for computer modeling electrical characteristics of integrated circuit cells having given circuit elements, wherein the electrical characteristic is a current leakage characteristic, wherein determining a relationship between a proximity context of a reference circuit element and the current leakage characteristic of the reference circuit element includes generating a model of the reference circuit element in a proximity context defined by a plurality of structural parameters, iteratively varying at least one of structural parameters over a given range and, at each iteration, performing a current leakage analysis to generate, by a plurality of the iterations, a proximity context versus current leakage characteristic for the reference circuit element, and wherein the determined relationship is based on the proximity context versus current leakage characteristic.

12. The method of claim 1 for computer modeling electrical characteristics of integrated circuit cells having given circuit elements, wherein the electrical characteristic is a dynamic power characteristic, wherein determining a relationship between a proximity context of a reference circuit element and the dynamic power characteristic of the reference circuit element includes generating a model of the reference circuit element in a proximity context defined by a plurality of structural parameters, iteratively varying at least one of structural parameters over a given range and, at each iteration, performing a dynamic power analysis to generate, by a plurality of the iterations, a proximity context versus dynamic power characteristic for the reference circuit element, and wherein the determined relationship is based on the proximity context versus dynamic power characteristic.

13. The method of claim 1 for computer modeling electrical characteristics of integrated circuit cells having given circuit elements, wherein the electrical characteristic is a noise characteristic, wherein determining a relationship between a proximity context of a reference circuit element and the noise characteristic of the reference circuit element includes generating a model of the reference circuit element in a proximity context defined by a plurality of structural parameters, iteratively varying at least one of structural parameters over a given range and, at each iteration, performing a noise analysis to generate, by a plurality of the iterations, a proximity context versus noise characteristic for the reference circuit element, and wherein the determined relationship is based on the proximity context versus noise characteristic.

14. The method of claim 1 for computer modeling electrical characteristics of integrated circuit cells having given circuit elements, wherein the electrical characteristic is an I-V curve characteristic, wherein determining the relationship between a proximity context of a reference circuit element and the I-V curve characteristic of the reference circuit element includes generating a model of the reference circuit element in a proximity context defined by a plurality of structural parameters, iteratively varying at least one of structural parameters over a given range and, at each iteration, performing an I-V curve analysis to generate, by a plurality of the iterations, a proximity context versus I-V curve characteristic for the reference circuit element, and wherein the determined relationship is based on the proximity context versus I-V curve characteristic.

15. The method of claim 1 for computer modeling electrical characteristics of integrated circuit cells having given circuit elements, wherein said generating a plurality of cell proximity context models includes:
   selecting a plurality of reference proximity contexts based on the determined relationship and at least one given electrical characteristic value; and
   generating the plurality of cell proximity context models based on a given model of the cell and the plurality of reference proximity contexts,
   wherein said selecting selects, based on a target electrical characteristic value, a minimum reference proximity context, an average reference proximity context and a maximum reference proximity context,
   wherein generating the plurality of cell proximity context models, based on a given model of the cell and the plurality of reference proximity contexts, generates a maximum electrical characteristic cell proximity context model, an average electrical characteristic cell proximity context model, and minimum electrical characteristic cell proximity context model.

16. The method of claim 15 for computer modeling electrical characteristics of integrated circuit cells having given circuit elements, wherein the electrical characteristic is time delay, the method further comprising: generating, based on a cell proximity context model, a modeled maximum time delay value, a modeled average time value and a modeled minimum time delay value.

17. The method of claim 16 for computer modeling electrical characteristics of integrated circuit cells having given circuit elements, further comprising generating a modeled slowest process-voltage-time (PVT) time delay value, based on the maximum time delay cell proximity context model and a given worst case PVT parameter value, a modeled average PVT time delay value, based on the average time delay cell proximity context model and a given average case PVT parameter value, and a modeled fastest PVT time delay value, based on the minimum time delay cell proximity context model and a given best case PVT parameter,
   wherein generating a modeled slowest PVT time delay value comprises:
      performing a circuit extraction on the maximum time delay cell proximity context model based on given worst case PVT resistor-capacitance (RC) model parameter value to obtain a netlist result; and
      performing a timing analysis on said netlist result of the circuit extraction on the maximum time delay cell proximity context model;
   wherein generating a modeled average PVT time delay value comprises:
      performing a circuit extraction on the average time delay cell proximity context model based on a given average case PVT resistor-capacitance (RC) model parameter value to obtain a netlist result; and
      performing a timing analysis on said netlist result of the circuit extraction on the average time delay cell proximity context model; and
   wherein generating a modeled fastest PVT time delay value comprises:
      performing a circuit extraction on the minimum time delay cell proximity context model based on a given best case PVT resistor-capacitance (RC) model parameter value to obtain a netlist result; and
      performing a timing analysis on said netlist result of the circuit extraction on the minimum time delay cell proximity context model.

18. The method of claim 15 for computer modeling electrical characteristics of integrated circuit cells having given circuit elements, wherein the electrical characteristic is current leakage, the method further comprising: generating based on a cell proximity context model a modeled maximum current leakage value, a modeled average current leakage value and a modeled minimum current leakage value.

19. The method of claim 18 for computer modeling electrical characteristics of integrated circuit cells having given circuit elements, further comprising generating a modeled highest process-voltage-time (PVT) current leakage value, based on the current leakage cell proximity context model and a given worst case PVT parameter value, a modeled average PVT current leakage value, based on the average current leakage cell proximity context model and a given average case PVT parameter value, and a modeled lowest PVT current leakage value, based on the minimum current leakage cell proximity context model and a given best case PVT parameter, wherein generating a modeled highest PVT current leakage value comprises:

performing a circuit extraction on the maximum current leakage cell proximity context model based on a given worst case PVT resistor-capacitance (RC) model parameter value to obtain a netlist result; and performing a current leakage analysis on said netlist result of the circuit extraction on the maximum current leakage cell proximity context model;

wherein generating a modeled average PVT current leakage value comprises:

performing a circuit extraction on the average current leakage cell proximity context model based on a given average case PVT resistor-capacitance (RC) model parameter value to obtain a netlist result; and performing a current leakage analysis on said netlist result of the circuit extraction on the average current leakage cell proximity context model; and, wherein generating a modeled lowest PVT current leakage value comprises:

performing a circuit extraction on the minimum current leakage cell proximity context model based on a given best case PVT resistor-capacitance (RC) model parameter value to obtain a netlist result; and performing a current leakage analysis on said netlist result of the circuit extraction on the minimum current leakage cell proximity context model.

20. The method of claim 15 for computer modeling electrical characteristics of integrated circuit cells having given circuit elements, wherein the electrical characteristic is dynamic power, the method further comprising: generating based on a cell proximity context model a modeled maximum dynamic power value, a modeled average dynamic power value and a modeled minimum dynamic power value.

21. The method of claim 20 for computer modeling electrical characteristics of integrated circuit cells having given circuit elements, further comprising generating a modeled highest process-voltage-time (PVT) dynamic power value, based on the dynamic power cell proximity context model and a given worst case PVT parameter value, a modeled average PVT dynamic power value, based on the average dynamic power cell proximity context model and a given average case PVT parameter value, and a modeled lowest PVT dynamic power value, based on the minimum dynamic power cell proximity context model and a given best case PVT parameter, wherein generating a modeled highest PVT dynamic power value comprises:

performing a circuit extraction on the maximum dynamic power cell proximity context model based on a given worst case PVT resistor-capacitance (RC) model parameter value to obtain a netlist result; and performing a dynamic power analysis on said result of the circuit extraction on the maximum dynamic power cell proximity context model;

wherein generating a modeled average PVT dynamic power value comprises:

performing a circuit extraction on the average dynamic power cell proximity context model based on a given average case PVT resistor-capacitance (RC) model parameter value to obtain a netlist result; and performing a dynamic power analysis on said netlist result of the circuit extraction on the average dynamic power cell proximity context model; and, wherein generating a modeled lowest PVT dynamic power value comprises:

performing a circuit extraction on the minimum dynamic power cell proximity context model based on a given best case PVT resistor-capacitance (RC) model parameter value to obtain a netlist result; and performing a dynamic power analysis on said netlist result of the circuit extraction on the minimum dynamic power cell proximity context model.

22. The method of claim 15 for computer modeling electrical characteristics of integrated circuit cells having given circuit elements, wherein the electrical characteristic is noise, the method further comprising: generating based on a cell proximity context model a modeled maximum noise value, a modeled average noise value and a modeled minimum noise value.

23. The method of claim 22 for computer modeling electrical characteristics of integrated circuit cells having given circuit elements, further comprising generating a modeled highest process-voltage-time (PVT) noise value, based on the noise cell proximity context model and a given worst case PVT parameter value, a modeled average PVT noise value, based on the average noise cell proximity context model and a given average case PVT parameter value, and a modeled lowest PVT noise value, based on the minimum noise cell proximity context model and a given best case PVT parameter, wherein generating a modeled highest PVT noise value comprises:

performing a circuit extraction on the maximum noise cell proximity context model based on a given worst case PVT resistor-capacitance (RC) model parameter value to obtain a netlist result; and performing a noise analysis on said netlist result of the circuit extraction on the maximum noise cell proximity context model;

wherein generating a modeled average PVT noise value comprises:

performing a circuit extraction on the average noise cell proximity context model based on a given average case PVT resistor-capacitance (RC) model parameter value to obtain a netlist result; and performing a noise analysis on said netlist result of the circuit extraction on the average noise cell proximity context model; and wherein generating a modeled lowest PVT noise value comprises:

performing a circuit extraction on the minimum noise cell proximity context model based on a given best case PVT resistor-capacitance (RC) model parameter value to obtain a netlist result; and performing a noise analysis on said netlist result of the circuit extraction on the minimum noise cell proximity context model.

24. The method of claim 1 for computer modeling electrical characteristics of integrated circuit cells having given circuit elements, wherein said generating a cell layout comprises generating a cell layout having a first instance of a cell among the cells and a second instance of said cell, wherein said characterizing at least one instance of the at least one cell in said cell layout comprises characterizing said first instance of said cell in said cell layout, based on a value of a given structural parameter of said first instance of said cell, as one of the plurality of cell proximity context models associated with said cell, and characterizing said second instance of said cell in said cell layout, based on a value of a given structural parameter of said second instance of said cell, as one of the plurality of cell proximity context models associated with said cell, and wherein generating a characterized discrete electrical characteristic model of the layout of cells comprises substituting said first instance of said cell with said one of the plurality of cell proximity context models associated with said cell, a result obtained in the characterizing of said first instance, and substituting said second instance of said cell with said one of the plurality of cell proximity context models associated with cell, a result obtained in the characterizing of said second instance.

25. The method of claim 1 for computer modeling electrical characteristics of integrated circuit cells having given circuit elements, wherein said generating, for at least one of the cells, a plurality of cell proximity context models, comprises:

generating for a first cell of said cells, based on a given model of the first cell, the electrical characteristic, and the determined relationship, a plurality of first cell proximity context models, and generating for a second cell of said cells, based on a given model of the second cell, the electrical characteristic, and the determined relationship, a plurality of second cell proximity context models, wherein said generating a cell layout comprises generating a cell layout having an instance of said first cell and an instance of said second cell, wherein said characterizing at least one instance of the at least one cell in said cell layout comprises characterizing said instance of said first cell in said cell layout, based on a value of a given structural parameter of said instance of said first cell, as one of the plurality of first cell proximity context models associated with said first cell, and characterizing said instance of said second cell in said cell layout, based on a value of a given structural parameter of said instance of said second cell, as one of the plurality of second cell proximity context models associated with said second cell, and wherein generating a characterized discrete electrical characteristic model of the layout of cells comprises substituting said instance of said first cell with said one of the plurality of first cell proximity context models associated with said first cell, a result obtained in the characterizing of said instance of said first cell, and substituting said instance of said second cell said with one of the plurality of second cell proximity context models associated with said second cell, a result obtained in the characterizing of said instance of said second cell.

26. A computer program product having a non-transitory computer readable medium comprising instructions that, when read and executed by a processor, cause the processor to perform operations for modeling electrical characteristics of a layout of cells having given circuit elements, the instructions comprising instructions that cause a processor to:

determine a relationship between a proximity context of a reference circuit element and an electrical characteristic of the reference circuit element;

generate, for at least one of the cells, a plurality of cell proximity context models, based on a given model of the cell, the electrical characteristic, and the determined relationship;

generate a cell layout having at least one instance of the at least one cell;

characterize at least one instance of said at least one cell in said cell layout, based on a value of a given structural parameter of said at least one instance of said at least one cell, as one of a plurality of cell proximity context models associated with said at least one cell; and generate a characterized discrete electrical characteristic model of the cell layout by substituting said at least one instance of said at least one cell with one of said plurality of cell proximity context models, a result obtained in the characterizing the at least one cell.

27. The computer program product of claim 26, wherein the instructions represent the proximity context of the reference circuit element as a N-dimensional proximity context vector representing N physical parameters of the proximity context.

28. The computer program product of claim 26, wherein the instructions that cause the processor to generate the plurality of cell proximity context models include instructions that cause a processor to:

select a plurality of reference proximity contexts based on the determined relationship and at least one given electrical characteristic value; and generate the plurality of cell proximity context models based on a given model of the cell and the plurality of reference proximity contexts, wherein said selecting a plurality of reference proximity contexts selects, based on a target electrical characteristic value, R different reference proximity contexts, including a minimum reference proximity context, an average proximity context, and a maximum reference proximity context.

29. The computer program product of claim 26, wherein instructions that cause a processor to generate, for each of the plurality of proximity contexts, a corresponding plurality of modeled electrical characteristic values include instructions that cause a processor to perform an electrical characteristic analysis on each of the plurality of proximity contexts, wherein the characterized discrete electrical characteristic model of the cell layout includes a modeled electrical characteristic value of a cell proximity context model, a result obtained in the characterizing the at least one cell.

30. The computer program product of claim 26, wherein instructions that cause a processor to generate the plurality of cell proximity context models include instructions that cause a processor to:

select a plurality of reference proximity contexts based on the determined relationship and at least one given electrical characteristic value; and generate the plurality of cell proximity context models based on a given model of the cell and the plurality of reference proximity contexts, wherein the electrical characteristic is a time delay, and wherein the computer program product further comprises instructions that cause a processor perform a verification of the plurality of reference proximity contexts, by:

generating, for each of the plurality of reference proximity contexts, a corresponding plurality of modeled time delay values, by performing an electrical characteristic analysis on each of the plurality of reference proximity contexts, wherein a characterized discrete electrical characteristic model of the cell layout includes a modeled time delay value of a cell proximity context model, a result obtained in the characterizing the at least one cell.

31. The computer program product of claim 26, wherein instructions that cause processor to generate the plurality of cell proximity context models include instructions that a cause a processor to:
  select a plurality of reference proximity contexts based on the determined relationship and at least one given electrical characteristic value; and
  generate the plurality of cell proximity context models based on a given model of the cell and the plurality of reference proximity contexts,
  wherein the selected plurality of reference proximity contexts are a plurality of seed reference contexts, and the computer program product further includes instructions that cause a processor to verify the plurality of seed reference contexts, said instructions including instructions that cause a processor to:
  generate, for each of a plurality of given reference cells, a plurality of reference cell proximity contexts, based on a given model of the reference cell and the plurality of seed reference proximity contexts;
  generate, for each of the given reference cells having a generated plurality of plurality of reference cell proximity contexts, a corresponding plurality of modeled reference electrical characteristic values;
  generate a layout of cells, having at least one instance of reference cells among the plurality of given reference cells;
  perform an electrical characteristic analysis on the instances of reference cells in the cell layout and generate a corresponding reference standard electrical characteristic;
  characterize the reference cell at each of a plurality of instances of reference cells in the cell layout as one of a plurality of reference proximity contexts generated for said reference cell, based on a value of a given structural parameter of said reference cell;
  generate a characterized discrete model of the layout of cells by substituting the instances of reference cells in the testing layout with the modeled electrical characteristic value of the reference cell proximity contexts characterized for said reference cell;
  perform an electrical characteristic analysis on a discrete context model to generate a test electrical characteristic analysis; and
  generate a success/failure verification result based on a comparison of the test electrical characteristic analysis and the reference standard electrical characteristic.

32. The computer program product of claim 31, further comprising instructions that cause a processor to:
  set the seed reference proximity contexts as the reference proximity contexts if the success/failure verification result indicates success; else
  update the seed reference proximity contexts and repeat said verification.

33. The computer program product of claim 26, wherein the instructions that cause a processor to generate the plurality of cell proximity context models include instructions that cause a processor to:
  select a plurality of reference proximity contexts based on the determined relationship and the at least one given electrical characteristic value; and
  generate the plurality of cell proximity context models based on a given model of the cell and the plurality of reference proximity contexts,
  wherein the computer program product further comprises instructions that cause a processor to update a given design tool constraint based on the selected plurality of reference proximity contexts, wherein the instructions that cause a processor to generate a testing layout generate the testing layout based on the given updated design tool constraint.

34. The computer program product of claim 26, wherein the instructions that cause a processor to determine the relationship between the proximity context of a reference circuit element and an electrical characteristic of the reference circuit element include instructions that cause a processor to generate a model of the reference circuit element in a proximity context defined by a plurality of the structural parameters, iteratively vary at least one of structural parameters over a given range and, at each iteration, perform an analysis to generate, by a plurality of the iterations, a proximity context versus electrical characteristic for the reference circuit element, and wherein the determined relationship is based on the proximity context versus electrical characteristic.

35. The computer program product of claim 26, wherein the electrical characteristic is a time delay characteristic, wherein the instructions that cause a processor to determine a relationship between a proximity context of a reference circuit element and the time delay characteristic of the reference circuit element include instructions that cause a processor to generate a model of the reference circuit element in a proximity context defined by a plurality of structural parameters, iteratively vary at least one of structural parameters over a given range and, at each iteration, perform a timing analysis to generate, by a plurality of the iterations, a proximity context versus time delay characteristic for the reference circuit element, and wherein the determined relationship is based on the proximity context versus time delay characteristic.

36. The computer program product of claim 26, wherein the electrical characteristic is a current leakage characteristic, wherein the instructions that cause a processor to determine a relationship between a proximity context of a reference circuit element and the current leakage characteristic of the reference circuit element include instructions that cause a processor to generate a model of the reference circuit element in a proximity context defined by a plurality of structural parameters, iteratively vary at least one of structural parameters over a given range and, at each iteration, perform a timing analysis to generate, by a plurality of the iterations, a proximity context versus current leakage characteristic for the reference circuit element, and wherein the determined relationship is based on the proximity context versus current leakage characteristic.

37. The computer program product of claim 26, wherein the electrical characteristic is a dynamic power characteristic, wherein the instructions that cause a processor to determine a relationship between a proximity context of a reference circuit element and the dynamic power characteristic of the reference circuit element include instructions that cause a processor to generate a model of the reference circuit element in a proximity context defined by a plurality of structural parameters, iteratively vary at least one of structural parameters over a given range and, at each iteration, perform a timing analysis to generate, by a plurality of the iterations, a proximity context versus dynamic power characteristic for the reference circuit element, and wherein the determined relationship is based on the proximity context versus dynamic power characteristic.

38. The computer program product of claim 26, wherein the electrical characteristic is a noise characteristic, wherein the instructions that cause a processor to determine a relationship between a proximity context of a reference circuit element and the noise characteristic of the reference circuit element include instructions that cause a processor to generate a model of the reference circuit element in a proximity context defined by a plurality of structural parameters, iteratively vary at least one of structural parameters over a given range and, at each iteration, perform a timing analysis to generate, by a plurality of the iterations, a proximity context versus noise characteristic for the reference circuit element, and wherein the determined relationship is based on the proximity context versus noise characteristic.

39. The computer program product of claim 26, wherein the electrical characteristic is an I-V curve characteristic, wherein the instructions that cause a processor to determine a relationship between a proximity context of a reference circuit element and the I-V curve characteristic of the reference circuit element include instructions that cause a processor to generate a model of the reference circuit element in a proximity context defined by a plurality of structural parameters, iteratively vary at least one of structural parameters over a given range and, at each iteration, perform a timing analysis to generate, by a plurality of the iterations, a proximity context versus I-V curve characteristic for the reference circuit element, and wherein the determined relationship is based on the proximity context versus I-V curve characteristic.

40. The computer program product of claim 26, wherein the instructions that cause a processor to generate the plurality of cell proximity context models include instructions that cause a processor to:
  select a plurality of reference proximity contexts based on the determined relationship and at least one given electrical characteristic value; and
  generate the plurality of cell proximity context models based on a given model of the cell and the plurality of reference proximity contexts,
  wherein said selecting selects, based on a target electrical characteristic value, a minimum reference proximity context, an average reference proximity context and a maximum reference proximity context,
  wherein generating the plurality of cell proximity context models, based on a given model of the cell and the plurality of reference proximity contexts, generates a maximum electrical characteristic cell proximity context model, an average electrical characteristic cell proximity context model, and minimum electrical characteristic cell proximity context model.

41. The computer program product of claim 40, wherein the electrical characteristic is time delay, the computer program product further comprising instructions that cause a processor to generate, based on the cell proximity context model, a modeled maximum time delay value, a modeled average time value and a modeled minimum time delay value.

42. The computer program product of claim 41, further comprising instructions that cause a processor to generate a modeled slowest process-voltage-time (PVT) time delay value, based on the maximum time delay cell proximity context model and a given worst case PVT parameter value, a modeled average PVT time delay value, based on the average time delay cell proximity context model and a given average case PVT parameter value, and a modeled fastest PVT time delay value, based on the minimum time delay cell proximity context model and a given best case PVT parameter,
  wherein said generating a modeled slowest PVT time delay value comprises:
    performing a circuit extraction on the maximum delay cell proximity context model based on a given worst case PVT resistor-capacitance (RC) model parameter value; and
    performing a timing analysis on a result of the circuit extraction;
  wherein said generating a modeled average PVT time delay value comprises:
    performing a circuit extraction on the average delay cell proximity context model based on a given average case PVT resistor-capacitance (RC) model parameter value; and
    performing a timing analysis on a result of the circuit extraction; and
  wherein said generating a modeled fastest PVT time delay value comprises:
    performing a circuit extraction on the minimum delay cell proximity context model based on a given best case PVT resistor-capacitance (RC) model parameter value; and
    performing a timing analysis on a result of the circuit extraction.

43. The computer program product of claim 40, wherein the electrical characteristic is current leakage, the computer program product further comprising instructions that cause a processor to generate, based on the cell proximity context model, a modeled maximum current leakage value, a modeled average leakage value and a modeled minimum current leakage value.

44. The computer program product of claim 43, further comprising instructions that cause a processor to generate a modeled highest process-voltage-time (PVT) current leakage value, based on the maximum current leakage cell proximity context model and a given worst case PVT parameter value, a modeled average PVT current leakage value, based on the average current leakage cell proximity context model and a given average case PVT parameter value, and a modeled lowest PVT current leakage value, based on the minimum current leakage cell proximity context model and a given best case PVT parameter,
  wherein said generating a modeled highest PVT current leakage value comprises:
    performing a circuit extraction on the maximum current leakage cell proximity context model based on a given worst case PVT resistor-capacitance (RC) model parameter value; and
    performing a current leakage analysis on a result of the circuit extraction;
  wherein said generating a modeled average PVT current leakage value comprises:
    performing a circuit extraction on the average current leakage cell proximity context model based on a given average case PVT resistor-capacitance (RC) model parameter value; and
    performing a current leakage analysis on a result of the circuit extraction; and
  wherein said generating a modeled lowest PVT current leakage value comprises:
    performing a circuit extraction on the minimum current leakage cell proximity context model based on a given best case PVT resistor-capacitance (RC) model parameter value; and
    performing a current leakage analysis on a result of the circuit extraction.

45. The computer program product of claim 40, wherein the electrical characteristic is dynamic power, the computer program product further comprising instructions that cause a processor to generate, based on the cell proximity context model, a modeled maximum dynamic power value, a modeled average dynamic power value and a modeled minimum dynamic power value.

46. The computer program product of claim 45, further comprising instructions that cause a processor to generate a modeled highest process-voltage-time (PVT) dynamic power value, based on the maximum dynamic power cell proximity context model and a given worst case PVT parameter value, a modeled average PVT dynamic power value, based on the average dynamic power cell proximity context model and a given average case PVT parameter value, and a modeled lowest PVT dynamic power value, based on the minimum dynamic power cell proximity context model and a given best case PVT parameter, wherein said generating a modeled highest PVT dynamic power value comprises:
performing a circuit extraction on the maximum dynamic power cell proximity context model based on a given worst case PVT resistor-capacitance (RC) model parameter value; and
performing a dynamic power analysis on a result of the circuit extraction;

wherein said generating a modeled average PVT time delay value comprises:
performing a circuit extraction on the average dynamic power cell proximity context model based on a given average case PVT resistor-capacitance (RC) model parameter value; and
performing a dynamic power analysis on a result of the circuit extraction; and wherein said generating a modeled lowest PVT dynamic power value comprises:
performing a circuit extraction on the minimum dynamic power cell proximity context model based on a given best case PVT resistor-capacitance (RC) model parameter value; and
performing a dynamic power analysis on a result of the circuit extraction.

47. The computer program product of claim 40, wherein the electrical characteristic is noise, the computer program product further comprising instructions that cause a processor to generate, based on the cell proximity context model, a modeled maximum noise value, a modeled average noise value and a modeled minimum noise value.

48. The computer program product of claim 47, further comprising instructions that cause a processor to generate a modeled highest process-voltage-time (PVT) noise value, based on the maximum noise cell proximity context model and a given worst case PVT parameter value, a modeled average PVT noise value, based on the average noise cell proximity context model and a given average case PVT parameter value, and a modeled lowest PVT noise value, based on the minimum noise cell proximity context model and a given best case PVT parameter, wherein said generating a modeled highest PVT noise value comprises:
performing a circuit extraction on the maximum noise cell proximity context model based on a given worst case PVT resistor-capacitance (RC) model parameter value; and
performing a noise analysis on a result of the circuit extraction;

wherein said generating a modeled average PVT time delay value comprises:
performing a circuit extraction on the average noise cell proximity context model based on a given average case PVT resistor-capacitance (RC) model parameter value; and
performing a noise analysis on a result of the circuit extraction; and wherein said generating a modeled lowest PVT noise value comprises:
performing a circuit extraction on the minimum noise cell proximity context model based on a given best case PVT resistor-capacitance (RC) model parameter value; and
performing a noise analysis on a result of the circuit extraction.

49. The computer program product of claim 26, wherein the instructions that cause a processor to generate a cell layout include instructions that cause a processor to generate a cell layout having a first instance of a cell among the cells and a second instance of said cell, wherein the instructions that cause a processor to characterize at least one instance of the at least one cell in said cell layout comprise instructions that cause a computer to
characterize said first instance of said cell in said cell layout, based on a value of a given structural parameter of said first instance of said cell, as one of the plurality of cell proximity context models associated with said cell, and
characterize said second instance of said cell in said cell layout, based on a value of a given structural parameter of said second instance of said cell, as one of the plurality of cell proximity context models associated with said cell, and wherein the instructions that cause a processor to generate a characterized discrete electrical characteristic model of the layout of cells comprise instructions that cause a processor to
substitute said first instance of said cell with said one of the plurality of cell proximity context models associated with said cell, a result obtained in the characterizing of said first instance, and
substitute said second instance of said cell with said one of the plurality of cell proximity context models associated with said cell, a result obtained in the characterizing of said second instance.

50. The computer program product of claim 26, wherein the instructions that cause a processor to generate, for at least one of the cells, a plurality of cell proximity context models, comprise instructions that cause a processor to
generate for a first cell of said cells, based on a given model of the first cell, the electrical characteristic, and the determined relationship, a plurality of first cell proximity context models, and
generate for a second cell of said cells, based on a given model of the second cell, the electrical characteristic, and the determined relationship, a plurality of second cell proximity context models, wherein the instructions that cause a processor to generate a cell layout comprise instructions that cause the processor to generate a cell layout having an instance of said first cell and an instance of said second cell, wherein the instructions that cause a processor to characterize at least one instance of the at least one cell in said cell layout comprise instructions that cause a processor to characterize said instance of said first cell in said cell layout, based on a value of a given structural parameter of said instance of said first cell, as one of the plurality of first cell proximity context models associated with said first cell, and characterize said instance of said second cell in said cell layout, based on a value of a given structural parameter of said instance of said second cell, as one of the plurality of second cell proximity context models associated with said second cell, and wherein the instructions that cause a processor to generate a characterized discrete electrical characteristic model of the layout of cells comprise instructions that cause a processor to substitute said instance of said first cell with said one of the plurality of first cell proximity context models associated with said first cell, a result obtained in the characterizing of said instance of said first cell, and substitute said instance of said second cell said with one of the plurality of second cell proximity context models associated with said second cell, a result obtained in the characterizing of said instance of said second cell.

51. A method for computer modeling electrical characteristics of an integrated circuit layout of cells having given circuit elements, comprising steps of:

determining a relationship between a proximity context of a reference circuit element and an electrical characteristic of the reference circuit element;

generating, for at least one of the cells, a plurality of cell proximity context models, based on a given model of the cell, the electrical characteristic, and the determined relationship;

generating a cell layout having at least one instance of said at least one cell;

characterizing at least one instance of said at least one cell in the cell layout, based on a value of a given structural parameter of said at least one cell, as one of a plurality of cell proximity context models associated with said at least one cell; and generating a characterized discrete electrical characteristic model of the cell layout by substituting said at least one instance of said at least one cell with a result of said one of said plurality of cell proximity context models characterized in said characterizing, wherein at least one of said step of determining a relationship, said step of generating a plurality of cell proximity context models, said step of generating a cell layout, said step of characterizing at least one instance of said at least one instance of the cell, and said step of generating a characterized discrete electrical characteristic model of the cell layout is performed by a processor in accordance with instructions stored in a computer-readable storage medium coupled to the processor.

52. The method of claim 51 for computer modeling electrical characteristics of an integrated circuit layout of cells having given circuit elements, wherein the proximity context of the reference circuit element is represented as a N-dimensional proximity context vector representing N physical parameters of the proximity context.

53. The method of claim 52 for computer modeling electrical characteristics of an integrated circuit layout of cells having given circuit elements, wherein the step of generating a plurality of cell proximity context models includes steps of:

selecting a plurality of reference proximity contexts based on the determined relationship and at least one given electrical characteristic value; and generating the plurality of cell proximity context models based on a given model of the cell and the plurality of reference proximity contexts, wherein the step of selecting a plurality of reference proximity contexts selects, based on a target electrical characteristic value, R different reference proximity contexts, including a minimum reference proximity context, an average reference context, and a maximum reference proximity context.

54. The method of claim 51 for computer modeling electrical characteristics of an integrated circuit layout of cells having given circuit elements, wherein the step of generating, for each of the plurality of proximity contexts, a corresponding plurality of modeled electrical characteristic values includes the step of performing an electrical characteristic analysis on each of the plurality of proximity contexts, wherein a characterized discrete electrical characteristic model of the layout of cells generated a modeled electrical characteristic value of a cell proximity context model, a result obtained in the characterizing the at least one cell.

55. The method of claim 51 for computer modeling electrical characteristics of an integrated circuit layout of cells having given circuit elements, wherein the step of generating a plurality of cell proximity context models includes steps of:

selecting a plurality of reference proximity contexts based on the determined relationship and at least one given electrical characteristic value; and generating the plurality of cell proximity context models based on a given model of the cell and the plurality of reference proximity contexts, wherein the electrical characteristic is a time delay, the method further comprising steps of:

generating, for each of the plurality of reference proximity contexts, a corresponding plurality of modeled time delay values, by performing an electrical characteristic analysis on each of the plurality of reference proximity contexts, wherein a characterized discrete electrical characteristic model of the layout of cells generated a modeled time delay value of a cell proximity context model, a result obtained in the characterizing the at least one cell.

56. The method of claim 51 for computer modeling electrical characteristics of an integrated circuit layout of cells having given circuit elements, wherein the step of generating a plurality of cell proximity context models includes steps of:

selecting a plurality of reference proximity contexts based on the determined relationship and at least one given electrical characteristic value; and generating the plurality of cell proximity context models based on a given model of the cell and the plurality of reference proximity contexts, wherein the selected plurality of reference proximity contexts are a plurality of seed reference contexts, and the method further comprises verifying the plurality of seed reference contexts, the verifying comprising steps of:

generating, for each of a plurality of given reference cells, a plurality of reference cell proximity contexts, based on a given model of the reference cell and the plurality of seed reference proximity contexts;

generating, for each of the given reference cells having a generated plurality of plurality of reference cell proximity contexts, a corresponding plurality of modeled reference electrical characteristic values;

generating a cell layout, having at least one instance of reference cells among the plurality of given reference cells;

performing an electrical characteristic analysis on instances of reference cells in the cell layout and generating a corresponding reference standard electrical characteristic;

characterizing the reference cell at each of a plurality of instances of reference cells in the cell layout as one of a plurality of reference proximity contexts generated for said reference cell;

generating a characterized discrete model of the cell layout by substituting the instances of reference cells in the testing layout with the modeled electrical characteristic value of the reference cell proximity contexts characterized for said reference cell;

performing an electrical characteristic analysis on a discrete context model to generate a test electrical characteristic analysis; and generating a success/failure verification result based on a comparison of the test electrical characteristic analysis and the reference standard electrical characteristic.

57. The method of claim 56 for computer modeling electrical characteristics of an integrated circuit layout of cells having given circuit elements, further comprising steps of:

setting the seed reference proximity contexts as the reference proximity contexts if the success/failure verification result indicates success; else updating of the seed reference proximity contexts and repeating said verifying.

58. The method of claim 51 for computer modeling electrical characteristics of an integrated circuit layout of cells having given circuit elements, wherein the step of generating a plurality of cell proximity context models includes steps of:

selecting a plurality of reference proximity contexts based on the determined relationship and the at least one given electrical characteristic value; and generating the plurality of cell proximity context models based on a given model of the cell and the plurality of reference proximity contexts, the method further comprising: step of updating a given design tool constraint based on the selected plurality of reference proximity contexts, wherein step of generating a testing cell layout generates the testing cell layout based on the updated given design tool constraint, wherein said updating a given design tool constraint comprises updating design tool instructions stored in a computer readable storage medium coupled to a processor, and wherein said generating a testing layout includes the processor executing the updated design tool instructions.

59. The method of claim 51 for computer modeling electrical characteristics of an integrated circuit layout of cells having given circuit elements, wherein the step of determining a relationship between a proximity context of a reference circuit element and an electrical characteristic of the reference circuit element includes steps of generating a model of the reference circuit element in a proximity context defined by a plurality of structural parameters, iteratively varying at least one of the structural parameters over a given range and, at each iteration, performing an analysis to generate, by a plurality of the iterations, a proximity context versus electrical characteristic for the reference circuit element, and wherein the determined relationship is based on the proximity context versus electrical characteristic.

60. The method of claim 51 for computer modeling electrical characteristics of an integrated circuit layout of cells having given circuit elements, wherein the electrical characteristic is a time delay, characteristic wherein the step of determining a relationship between a proximity context of a reference circuit element and the time delay characteristic of the reference circuit element includes steps of generating a model of the reference circuit element in a proximity context defined by a plurality of structural parameters, iteratively varying at least one of structural parameters over a given range and, at each iteration, performing a timing analysis to generate, by a plurality of the iterations, a proximity context versus time delay characteristic for the reference circuit element, and wherein the determined relationship is based on the proximity context versus time delay characteristic.

61. The method of claim 51 for computer modeling electrical characteristics of an integrated circuit layout of cells having given circuit elements, wherein the electrical characteristic is a current leakage characteristic, wherein the step of determining the relationship between the proximity context of a reference circuit element and the current leakage characteristic of the reference circuit element includes steps of generating a model of the reference circuit element in a proximity context defined by a plurality of structural parameters, iteratively varying at least one of structural parameters over a given range and, at each iteration, performing a current leakage analysis to generate, by a plurality of the iterations, a proximity context versus current leakage characteristic for the reference circuit element, and wherein the determined relationship is based on the proximity context versus current leakage characteristic.

62. The method of claim 51 for computer modeling electrical characteristics of an integrated circuit layout of cells having given circuit elements, wherein the electrical characteristic is a dynamic power characteristic, wherein the step of determining a relationship between a proximity context of a reference circuit element and the dynamic power characteristic of the reference circuit element includes steps of generating a model of the reference circuit element in a proximity context defined by a plurality of structural parameters, iteratively varying at least one of structural parameters over a given range and, at each iteration, performing a dynamic power analysis to generate, by a plurality of the iterations, a proximity context versus dynamic power characteristic for the reference circuit element, and wherein the determined relationship is based on the proximity context versus dynamic power characteristic.

63. The method of claim 51 for computer modeling electrical characteristics of an integrated circuit layout of cells having given circuit elements, wherein the electrical characteristic is a noise characteristic, wherein the step of determining a relationship between a proximity context of a reference circuit element and the noise characteristic of the reference circuit element includes steps of generating a model of the reference circuit element in a proximity context defined by a plurality of structural parameters, iteratively varying at least one of structural parameters over a given range and, at each iteration, performing a noise analysis to generate, by a plurality of the iterations, a proximity context versus noise characteristic for the reference circuit element, and wherein the determined relationship is based on the proximity context versus noise characteristic.

64. The method of claim 51 for computer modeling electrical characteristics of an integrated circuit layout of cells having given circuit elements, wherein the electrical characteristic is an I-V curve characteristic, wherein the step of determining a relationship between a proximity context of a reference circuit element and the I-V curve characteristic of the reference circuit element includes steps of generating a model of the reference circuit element in a proximity context defined by a plurality of structural parameters, iteratively varying at least one of structural parameters over a given range and, at each iteration, performing an I-V curve analysis to generate, by a plurality of the iterations, a proximity context versus I-V curve characteristic for the reference circuit element, and wherein the determined relationship is based on the proximity context versus I-V curve characteristic.

65. The method of claim 51 for computer modeling electrical characteristics of an integrated circuit layout of cells having given circuit elements, wherein the step of generating a plurality of cell proximity context models includes steps of:
selecting a plurality of reference proximity contexts based on the determined relationship and at least one given electrical characteristic value; and
generating the plurality of cell proximity context models based on a given model of the cell and the plurality of reference proximity contexts,
wherein said selecting selects, based on a target electrical characteristic value, a minimum reference proximity context, an average reference proximity context and a maximum reference proximity context,
wherein the step of generating the plurality of cell proximity context models, based on a given model of the cell and the plurality of reference proximity contexts, generates a maximum electrical characteristic cell proximity context model, an average electrical characteristic cell proximity context model, and minimum electrical characteristic cell proximity context model.

66. The method of claim 65 for computer modeling electrical characteristics of an integrated circuit layout of cells having given circuit elements, wherein the electrical characteristic is time delay, the method further comprising: step of generating, based on a cell proximity context model, a modeled maximum time delay value, a modeled average time value and a modeled minimum time delay value.

67. The method of claim 66 for computer modeling electrical characteristics of an integrated circuit layout of cells having given circuit elements, further comprising steps of generating a modeled slowest process-voltage-time (PVT) time delay value, based on the maximum time delay cell proximity context model and a given worst case PVT parameter value, a modeled average PVT time delay value, based on the average time delay cell proximity context model and a given average case PVT parameter value, and a modeled fastest PVT time delay value, based on the minimum time delay cell proximity context model and a given best case PVT parameter,
wherein said generating a modeled slowest PVT time delay value comprises steps of:
performing a circuit extraction on the maximum time delay cell proximity context model based on a given worst case PVT resistor-capacitance (RC) model parameter value to obtain a netlist result; and
performing a timing analysis on said netlist result of the circuit extraction on the maximum time delay cell proximity context model;
wherein said generating a modeled average PVT time delay value comprises:
performing a circuit extraction on the average time delay cell proximity context model based on a given average case PVT resistor-capacitance (RC) model parameter value to obtain a netlist result; and
performing a timing analysis on said netlist result of the circuit extraction on the average time delay cell proximity context model; and
wherein generating the modeled fastest PVT time delay value comprises:
performing a circuit extraction on the minimum time delay cell proximity context model based on a given best case PVT resistor-capacitance (RC) model parameter value to obtain a netlist result; and
performing a timing analysis on said netlist result of the circuit extraction on the minimum time delay cell proximity context model.

68. The method of claim 65 for computer modeling electrical characteristics of an integrated circuit layout of cells having given circuit elements, wherein the electrical characteristic is current leakage, the method further comprising steps of: generating, based on a cell proximity context model, a modeled maximum current leakage value, a modeled average current leakage value and a modeled minimum current leakage value.

69. The method of claim 68 for computer modeling electrical characteristics of an integrated circuit layout of cells having given circuit elements, further comprising steps of generating a modeled highest process-voltage-time (PVT) current leakage value, based on the current leakage cell proximity context model and a given worst case PVT parameter value, a modeled average PVT current leakage value, based on the average current leakage cell proximity context model and a given average case PVT parameter value, and a modeled lowest PVT current leakage value, based on the minimum current leakage cell proximity context model and a given best case PVT parameter,
wherein said generating a modeled highest PVT current leakage value comprises steps of:
performing a circuit extraction on the maximum current leakage cell proximity context model based on a given worst case PVT resistor-capacitance (RC) model parameter value to obtain a netlist result; and
performing a current leakage analysis on said netlist result of the circuit extraction on the maximum current leakage cell proximity context model;
wherein said generating a modeled average PVT current leakage value comprises:
performing a circuit extraction on the average current leakage cell proximity context model based on a given average case PVT resistor-capacitance (RC) model parameter value to obtain a netlist result; and
performing a current leakage analysis on said netlist result of the circuit extraction on the average current leakage cell proximity context model; and
wherein said generating a modeled lowest PVT current leakage value comprises:
performing a circuit extraction on the minimum current leakage cell proximity context model based on a given best case PVT resistor-capacitance (RC) model parameter value to obtain a netlist result; and
performing a current leakage analysis on said netlist result of the circuit extraction on the minimum current leakage cell proximity context model.

70. The method of claim 65 for computer modeling electrical characteristics of an integrated circuit layout of cells having given circuit elements, wherein the electrical characteristic is dynamic power, the method further comprising steps of: generating, based on a cell proximity context model, a modeled maximum dynamic power value, a modeled average dynamic power value and a modeled minimum dynamic power value.

71. The method of claim 70 for computer modeling electrical characteristics of an integrated circuit layout of cells having given circuit elements, further comprising steps of generating a modeled highest process-voltage-time (PVT) dynamic power value, based on the dynamic power cell proximity context model and a given worst case PVT parameter value, a modeled average PVT dynamic power value, based on the average dynamic power cell proximity context model and a given average case PVT parameter value, and a modeled lowest PVT dynamic power value, based on the minimum dynamic power cell proximity context model and a given best case PVT parameter, wherein said generating a modeled highest PVT dynamic power value comprises steps of:

performing a circuit extraction on the maximum dynamic power cell proximity context model based on a given worst case PVT resistor-capacitance (RC) model parameter value to obtain a netlist result; and performing a dynamic power analysis on said netlist result of the circuit extraction on the maximum dynamic power cell proximity context model;

wherein said generating a modeled average PVT dynamic power value comprises:

performing a circuit extraction on the average dynamic power cell proximity context model based on a given average case PVT resistor-capacitance (RC) model parameter value to obtain a netlist result; and performing a dynamic power analysis on said netlist result of the circuit extraction on the average dynamic power cell proximity context model; and wherein said generating a modeled lowest PVT dynamic power value comprises:

performing a circuit extraction on the minimum dynamic power cell proximity context model based on a given best case PVT resistor-capacitance (RC) model parameter value to obtain a netlist result; and performing a dynamic power analysis on said netlist result of the circuit extraction on the minimum dynamic power cell proximity context model.

72. The method of claim 65 for computer modeling electrical characteristics of an integrated circuit layout of cells having given circuit elements, wherein the electrical characteristic is noise, the method further comprising steps of: generating, based on a cell proximity context model, a modeled maximum noise value, a modeled average noise value and a modeled minimum noise value.

73. The method of claim 72 for computer modeling electrical characteristics of an integrated circuit layout of cells having given circuit elements, further comprising the step of generating a modeled highest process-voltage-time (PVT) noise value, based on the noise cell proximity context model and a given worst case PVT parameter value, a modeled average PVT noise value, based on the average noise cell proximity context model and a given average case PVT parameter value, and a modeled lowest PVT noise value, based on the minimum noise cell proximity context model and a given best case PVT parameter, wherein said generating a modeled highest PVT noise value comprises steps of:

performing a circuit extraction on the maximum noise cell proximity context model based on a given worst case PVT resistor-capacitance (RC) model parameter value to obtain a netlist result; and performing a noise analysis on said enlist result of the circuit extraction on the maximum noise cell proximity context model;

wherein said generating a modeled average PVT noise value comprises:

performing a circuit extraction on the average noise cell proximity context model based on a given average case PVT resistor-capacitance (RC) model parameter value to obtain a netlist result; and performing a noise analysis on said enlist result of the circuit extraction on the average noise cell proximity context model; and wherein said generating a modeled lowest PVT noise value comprises:

performing a circuit extraction on the minimum noise cell proximity context model based on a given best case PVT resistor-capacitance (RC) model parameter value to obtain a netlist result; and performing a noise analysis on said enlist result of the circuit extraction on the minimum noise cell proximity context model.

74. The method of claim 51 for computer modeling electrical characteristics of an integrated circuit layout of cells having given circuit elements, wherein said set of generating a cell layout comprises generating a cell layout having a first instance of a cell among the cells and a second instance of said cell, wherein said step of characterizing at least one instance of the at least one cell in said cell layout comprises characterizing said first instance of said cell in said cell layout, based on a value of a given structural parameter of said first instance of said cell, as one of the plurality of cell proximity context models associated with said cell, and characterizing said second instance of said cell in said cell layout, based on a value of a given structural parameter of said second instance of said cell, as one of the plurality of cell proximity context models associated with said cell, and wherein said step of generating a characterized discrete electrical characteristic model of the layout of cells comprises substituting said first instance of said cell with said one of the plurality of cell proximity context models associated with said cell, a result obtained in the characterizing of said first instance, and substituting said second instance of said cell with said one of the plurality of cell proximity context models associated with cell, a result obtained in the characterizing of said second instance.

75. The method of claim 51 for computer modeling electrical characteristics of an integrated circuit layout of cells having given circuit elements, wherein said step of generating, for at least one of the cells, a plurality of cell proximity context models, comprises:

generating for a first cell of said cells, based on a given model of the first cell, the electrical characteristic, and the determined relationship, a plurality of first cell proximity context models, and generating for a second cell of said cells, based on a given model of the second cell, the electrical characteristic, and the determined relationship, a plurality of second cell proximity context models, wherein said step of generating a cell layout comprises generating a cell layout having an instance of said first cell and an instance of said second cell, wherein said step of characterizing at least one instance of the at least one cell in said cell layout comprises characterizing said instance of said first cell in said cell layout, based on a value of a given structural parameter of said instance of said first cell, as one of the plurality of first cell proximity context models associated with said first cell, and characterizing said instance of said second cell in said cell layout, based on a value of a given structural parameter of said instance of said second cell, as one of the plurality of second cell proximity context models associated with said second cell, and wherein said step of generating a characterized discrete electrical characteristic model of said cell layout comprises substituting said instance of said first cell with said one of the plurality of first cell proximity context models associated with said first cell, a result obtained in the characterizing of said instance of said first cell, and substituting said instance of said second cell said with one of the plurality of second cell proximity context models associated with said second cell, a result obtained in the characterizing of said instance of said second cell.

76. An apparatus for modeling electrical characteristics of a layout of cells having given circuit elements, comprising:

a processor; and a memory coupled to the processor, wherein the memory stores instructions causing the processor to determine a relationship between a proximity context of a reference circuit element and an electrical characteristic of the reference circuit element;

generate, for at least one of the cells, a plurality of cell proximity context models, based on a given model of the cell, the electrical characteristic, and the determined relationship;

generate a layout of cells having at least one instance of said at least one cell;

characterize at least one instance of said at least one cell in the layout of cells, based on the value of a given structural parameter of said at least one instance of said at least one cell, as one of the plurality of cell proximity context models associated with said at least one cell; and generate a characterized discrete electrical characteristic model of the layout of cells by substituting said instance of said at least one cell with said one of the plurality of cell proximity context models, a result obtained in the characterizing.

77. The apparatus of claim 76, wherein instructions that cause the processor to generate the plurality of cell proximity context models include instructions that cause the processor to:

select a plurality of reference proximity contexts based on the determined relationship and at least one given electrical characteristic value; and generate the plurality of cell proximity context models based on a given model of the cell and the plurality of reference proximity contexts, wherein the electrical characteristic is a time delay, wherein the instructions include instructions that cause the processor to perform a verification of the plurality of reference proximity contexts, by:

generating, for each of the plurality of proximity contexts, a corresponding plurality of modeled time delay values, by performing an electrical characteristic analysis on each of the plurality of proximity contexts, wherein the characterized discrete electrical characteristic model of the layout of cells includes a modeled time delay value of a cell proximity context model, a result obtained in the characterizing the at least one cell.

78. The apparatus of claim 76 for modeling electrical characteristics of a layout of cells having given circuit elements, wherein the instructions stored by the memory that cause the processor to generate a layout of cells include instructions that cause the processor to generate a layout of cells having a first instance of a cell among the cells and a second instance of said cell, wherein the instructions stored by the memory that cause the processor to characterize at least one instance of the at least one cell in said layout of cells comprise instructions that cause the processor to characterize said first instance of said cell in said layout of cells, based on a value of a given structural parameter of said first instance of said cell, as one of the plurality of cell proximity context models associated with said cell, and characterize said second instance of said cell in said layout of cells, based on a value of a given structural parameter of said second instance of said cell, as one of the plurality of cell proximity context models associated with said cell, and wherein the instructions stored by the memory that cause the processor to generate a characterized discrete electrical characteristic model of the layout of cells comprise instructions that cause the processor to substitute said first instance of said cell with said one of the plurality of cell proximity context models associated with said cell, a result obtained in the characterizing of said first instance, and substitute said second instance of said cell with said one of the plurality of cell proximity context models associated with said cell, a result obtained in the characterizing of said second instance.

79. The apparatus of claim 76 for modeling electrical characteristics of a layout of cells having given circuit elements, wherein the instructions stored by the memory that cause the processor to generate, for at least one of the cells, a plurality of cell proximity context models, comprise instructions that cause the processor to generate for a first cell of said cells, based on a given model of the first cell, the electrical characteristic, and the determined relationship, a plurality of first cell proximity context models, and generate for a second cell of said cells, based on a given model of the second cell, the electrical characteristic, and the determined relationship, a plurality of second cell proximity context models, wherein the instructions stored by the memory that cause the processor to generate a cell layout comprise instructions that cause the processor to generate a layout of cells having an instance of said first cell and an instance of said second cell, wherein the instructions stored by the memory that cause the processor to characterize at least one instance of the at least one cell in said layout of cells comprise instructions that cause the processor to characterize said instance of said first cell in said layout of cells, based on a value of a given structural parameter of said instance of said first cell, as one of the plurality of first cell proximity context models associated with said first cell, and characterize said instance of said second cell in said layout of cells, based on a value of a given structural parameter of said instance of said second cell, as one of the plurality of second cell proximity context models associated with said second cell, and wherein the instructions stored by the memory that cause the processor to generate a characterized discrete electrical characteristic model of the layout of cells comprise instructions that cause the processor to substitute said instance of said first cell with said one of the plurality of first cell proximity context models associated with said first cell, a result obtained in the characterizing of said instance of said first cell, and substitute said instance of said second cell said with one of the plurality of second cell proximity context models associated with said second cell, a result obtained in the characterizing of said instance of said second cell.

80. An apparatus for modeling electrical characteristics of a layout of cells having given circuit elements, comprising:
  means for determining a relationship between a proximity context of a reference circuit element and an electrical characteristic of the reference circuit element;
  means for generating, for at least one of the cells, a plurality of cell proximity context models, based on a given model of the cell, the electrical characteristic, and the determined relationship;
  means for generating a layout of cells having at least one instance of the at least one cell;
  means for characterizing at least one cell in the layout of cells, based on a value of a given structural parameter of said least one cell, as one of the plurality of cell proximity context models associated with the at least one cell; and
  means for generating a characterized discrete electrical characteristic model of the layout of cells by substituting said at least one instance of said at least one cell with said one of said plurality of cell proximity context models, a result obtained in said characterizing.

81. A method of claim for computer modeling electrical characteristics of cells having reference devices, comprising:
  placing on a computer simulation tool a model of a reference device and a model of a proximity context of the reference device, wherein the proximity context of the reference device models a spatial relationship of given physical regions of the reference device to given neighboring devices;
  determining on the computer simulation tool, for an electrical characteristic of the reference device, a relationship between a proximity context of the reference device and the electrical characteristic;
  selecting, based at least in part on the determined relationship, a first reference proximity context at which, in accordance with the determined relationship, the electrical characteristic of the reference device corresponds to a first given value, and a second reference proximity context at which, in accordance with the determined relationship, the electrical characteristic of the reference device corresponds to a second given value;
  placing on the computer simulation tool a model of a cell among a set of the cells;
  generating, for the cell, a cell first proximity context model and a cell second proximity context model, wherein said generating a cell first proximity context model comprises modifying the model of the cell in accordance with the first reference proximity context, and said generating a cell second proximity context model comprises modifying the model of the cell in accordance with the second reference proximity context;
  determining, by the computer simulation tool, as a modeled first value of the electrical characteristic, a value of the electrical characteristic of the cell first proximity context model and, as a modeled second value of the electrical characteristic, a value of the electrical characteristic of the cell second proximity context model;
  generating a layout of cells having an instance of the cell and having given devices neighboring the instance of the cell, and having given proximity parameters that relate to a spacing between given regions of the instance of the cell and given regions of the given devices neighboring said instance;
  classifying the instance of the cell between the cell first proximity context model and the cell second proximity context model, based on the given proximity parameters; and
  generating a discrete electrical characteristic model of the layout of cells by substituting, based on a result of the classifying, said instance of the cell with one of the modeled first value and the modeled second value of the electrical characteristic.

82. The method of claim 81, wherein selecting the first and the second reference proximity contexts comprises:
  selecting a seed first proximity context and a seed second proximity context;
  verifying on the computer simulation tool the seed first proximity context and the seed second proximity context; and
  if the verifying passes a given pass/fail criterion of modeling accuracy, setting the first reference proximity context as the seed first proximity context, and setting the second reference proximity context as the seed second proximity context, else
  selecting another seed first proximity context, or another seed second proximity context, or both, and repeating the verifying,
  wherein the verifying comprises:
  generating a cell first seed proximity context model conforming to the seed first proximity context and a cell second seed proximity context model conforming to the seed second proximity context;
  generating a test cell layout of cells, having an instance of a reference cell;
  performing, on the computer simulation tool, an electrical characteristic analysis on the instance of the reference cell in the test cell layout and generating a corresponding reference standard electrical characteristic;
  classifying the instance of the reference cell in the test cell layout between the cell first seed proximity context model and the cell second seed proximity context model based on a value of a given structural parameter of said at least one instance of the at least one reference cell;
  generating a discrete model of the test layout by substituting the instance of the reference cell in the test layout with a modeled value of the electrical characteristic of the cell first seed proximity context model or the modeled value of the electrical characteristic of the cell second seed proximity context model, based on a result of the classifying;
  performing, on the computer simulation tool, an electrical characteristic analysis on the discrete context model to generate a test electrical characteristic analysis; and
  generating a success/failure verification result based on a comparison of the test electrical characteristic analysis and the reference standard electrical characteristic.

83. The method of claim 81, wherein selecting the first reference proximity context and the second reference proximity context includes selecting, based at least in part on the determined relationship and the given value of the electrical characteristic, a third reference proximity context,
  wherein the first proximity context is a minimum reference proximity context, the third proximity context is an average reference proximity context, and the second proximity context is a maximum reference proximity context.

84. The method of claim 81, wherein the model of the proximity context placed on the computer simulation tool defines the spatial relationship of the given physical regions of the reference device to given neighboring devices by an N-tuple of parameters representing the spatial relationship in an N-dimensional space, and wherein determining a relationship between the proximity context of a reference device and an electrical characteristic of the reference device includes a plurality of iterations varying at least one of the N-tuple parameters over a given range and, at each iteration, performing on the simulation tool an analysis to generate a value of the electrical characteristic for the reference device corresponding to the proximity context defined by the value of the at least one of the N-tuple of parameters at said iteration.

85. A computer product having a non-transitory computer readable medium comprising instructions that, when read and executed by a processor, cause the processor to perform operations for modeling electrical characteristics of a layout of cells having given reference devices, the instructions comprising instructions that cause a processor to:

determine, for an electrical characteristic of a reference device, a relationship between a proximity context of the reference device and the electrical characteristic, wherein the proximity context of the reference device models a spatial relationship of given physical regions of the reference device to given neighboring devices;

select, based at least in part on the determined relationship, a first reference proximity context at which, in accordance with the determined relationship, the electrical characteristic of the reference device corresponds to a first given value, and a second reference proximity context at which, in accordance with the determined relationship, the electrical characteristic of the reference device corresponds to a second given value;

generate, for a cell having the reference device, a cell first proximity context model by modifying a given model of the cell in accordance with the first reference proximity context, and a cell second proximity context model by modifying the given model of the cell in accordance with the second reference proximity context;

determine, as a modeled first value of the electrical characteristic, a value of the electrical characteristic of the cell first proximity context model and, as a modeled second value of the electrical characteristic, a value of the electrical characteristic of the cell second proximity context model;

generate a layout of cells having at least instance of the cell and having given devices neighboring the at least one instance of the cell, and having given proximity parameters that relate to a spacing between given regions of the at least one instance of cell and given regions of the given devices neighboring the at least one instance;

classify at least one instance of the cell between the cell first proximity context model and the cell second proximity context model, based on the given proximity parameters; and generate a discrete electrical characteristic model of the layout of cells by substituting, based on a result of the classifying, said at least one instance of the cell with one of the modeled first value and the modeled second value of the electrical characteristic.

86. The computer product of claim 85, wherein the instructions that cause a processor to select the first reference proximity context and the second reference proximity context comprise instructions that cause a computer to:

select a seed first proximity context and a seed second proximity context;

verify whether the seed first proximity context and the seed second proximity context pass a given pass/fail criterion of modeling accuracy; and if the seed first proximity context and the seed second proximity context pass the given pass/fail criterion, to set the first reference proximity context as the seed first proximity context, and to set the second reference proximity context as the seed second proximity context, else to select another seed first proximity context, or another seed second proximity context, or both, and to repeat said verify, using the another seed first proximity context as the seed first proximity context, or the another seed second proximity context as the seed second proximity context, wherein the instructions that cause a processor to verify whether the seed first proximity context and the seed second proximity context pass a given pass/fail criterion of modeling accuracy comprise instructions that cause a computer to:

generate a cell first seed proximity context model conforming to the seed first proximity context and generate a cell second seed proximity context model conforming to the seed second proximity context;

generate a test layout of cells, having at least one instance of the reference cell;

perform an electrical characteristic analysis on at least one instance of the reference cell in the test cell layout and generate a corresponding reference standard electrical characteristic;

classify at least one instance of the reference cell in the test layout between the cell first seed proximity context model and the cell second seed proximity context model based on a value of a given structural parameter of said at least one reference cell;

generate a discrete model of the test layout by substituting at least one instance of the reference cell in the test layout with a modeled value of the electrical characteristic of the cell first seed proximity context model or the modeled value of the electrical characteristic of the cell second seed proximity context model, based on a result of the classifying;

perform an electrical characteristic analysis on the discrete context model to generate a test electrical characteristic analysis; and generate a success/failure verification result based on a comparison of the test electrical characteristic analysis and the reference standard electrical characteristic.

87. The computer product of claim 85, wherein the instructions that cause a processor to select the first reference proximity context and the second reference proximity context comprise instructions that cause a computer to select, based, at least in part, on the determined relationship and the given value of the electrical characteristic, a third reference proximity context, and wherein the first proximity context is a minimum reference proximity context, the third proximity context is an average reference proximity context, and the second proximity context is a maximum reference proximity.

88. The computer product of claim 85, wherein the model of the proximity context defines the spatial relationship of the given physical regions of the reference device to given neighboring devices by an N-tuple of parameters representing the spatial relationship in an N-dimensional space, wherein the instructions that cause a processor to determine a relationship between the proximity context of a reference device and an electrical characteristic of the reference device include instructions that cause the computer to perform a plurality of iterations varying at least one of the N-tuple parameters over a given range and, at each iteration, perform an analysis to generate a value of the electrical characteristic for the reference device corresponding to the proximity context defined by the value of the at least one of the N-tuple of parameters at said iteration.

89. A method of claim for computer modeling electrical characteristics of cells having reference devices, comprising steps of:

placing on a computer simulation tool a model of a reference device and a model of a proximity context of the reference device, wherein the proximity context of the reference device models a spatial relationship of given physical regions of the reference device to given neighboring devices;

determining on the computer simulation tool, for an electrical characteristic of the reference device, a relationship between a proximity context of the reference device and the electrical characteristic;

selecting, based at least in part on the determined relationship, a first reference proximity context at which, in accordance with the determined relationship, the electrical characteristic of the reference device corresponds to a first given value, and a second reference proximity context at which, in accordance with the determined relationship, the electrical characteristic of the reference device corresponds to a second given value;

placing on the computer simulation tool a model of a cell among a set of the cells;

generating, for the cell, a cell first proximity context model and a cell second proximity context model, wherein said generating a cell first proximity context model comprises modifying the model of the cell in accordance with the first reference proximity context, and said generating a cell second proximity context model comprises modifying the model of the cell in accordance with the second reference proximity context;

determining, by the computer simulation tool, as a modeled first value of the electrical characteristic, a value of the electrical characteristic of the cell first proximity context model and, as a modeled second value of the electrical characteristic, a value of the electrical characteristic of the cell second proximity context model;

generating a layout of cells having an instance of the cell and having given devices neighboring the instance of the cell, and having given proximity parameters that relate to a spacing between given regions of the instance of the cell and given regions of the given devices neighboring said instance;

classifying the instance of the cell between the cell first proximity context model and the cell second proximity context model, based on the given proximity parameters; and generating a discrete electrical characteristic model of the layout of cells by substituting, based on a result of the classifying, said instance of the cell with one of the modeled first value and the modeled second value of the electrical characteristic.

90. The method of claim 89, wherein said step of selecting the first and the second reference proximity contexts comprises steps of:

selecting a seed first proximity context and a seed second proximity context;

verifying on the computer simulation tool the seed first proximity context and the seed second proximity context; and if the verifying passes a given pass/fail criterion of modeling accuracy, setting the first reference proximity context as the seed first proximity context, and setting the second reference proximity context as the seed second proximity context, else selecting another seed first proximity context, or another seed second proximity context, or both, and repeating the verifying, wherein said step of verifying comprises steps of:

generating a cell first seed proximity context model conforming to the seed first proximity context and a cell second seed proximity context model conforming to the seed second proximity context;

generating a test cell layout of cells, having an instance of a reference cell;

performing, on the computer simulation tool, an electrical characteristic analysis on the instance of the reference cell in the test cell layout and generating a corresponding reference standard electrical characteristic;

classifying the instance of the reference cell in the test cell layout between the cell first seed proximity context model and the cell second seed proximity context model based on a value of a given structural parameter of said at least one instance of the at least one reference cell;

generating a discrete model of the test layout by substituting the instance of the reference cell in the test layout with a modeled value of the electrical characteristic of the cell first seed proximity context model or the modeled value of the electrical characteristic of the cell second seed proximity context model, based on a result of the classifying;

performing, on the computer simulation tool, an electrical characteristic analysis on the discrete context model to generate a test electrical characteristic analysis; and generating a success/failure verification result based on a comparison of the test electrical characteristic analysis and the reference standard electrical characteristic.

91. The method of claim 89, wherein said step of selecting the first reference proximity context and the second reference proximity context includes steps of selecting, based at least in part on the determined relationship and the given value of the electrical characteristic, a third reference proximity context, wherein the first proximity context is a minimum reference proximity context, the third proximity context is an average reference proximity context, and the second proximity context is a maximum reference proximity context.

92. The method of claim 89, wherein the model of the proximity context placed on the computer simulation tool defines the spatial relationship of the given physical regions of the reference device to given neighboring devices by an N-tuple of parameters representing the spatial relationship in an N-dimensional space, and wherein said step of determining a relationship between the proximity context of a reference device and an electrical characteristic of the reference device includes a plurality of iterations varying at least one of the N-tuple parameters over a given range and, at each iteration, performing on the simulation tool an analysis to generate a value of the electrical characteristic for the reference device corresponding to the proximity context defined by the value of the at least one of the N-tuple of parameters at said iteration.

93. An apparatus for modeling electrical characteristics of a layout of cells having given circuit elements, comprising:
a processor; and
a memory coupled to the processor, wherein the memory stores instructions causing the processor to
determine, for an electrical characteristic among a set of the electrical characteristics of a reference device, a relationship between a proximity context of the reference device and the electrical characteristic, wherein the proximity context of the reference device models a spatial relationship of given physical regions of the reference device to given neighboring devices;
select, based at least in part on the determined relationship, a first reference proximity context at which, in accordance with the determined relationship, the electrical characteristic of the reference device corresponds to a first given value, and a second reference proximity context at which, in accordance with the determined relationship, the electrical characteristic of the reference device corresponds to a second given value;
generate, for a cell among a set of the cells, a cell first proximity context model by modifying a given model of the cell in accordance with the first reference proximity context, and a cell second proximity context model by modifying the given model of the cell in accordance with the second reference proximity context;
determine, as a modeled first value of the electrical characteristic, a value of the electrical characteristic of the cell first proximity context model and, as a modeled second value of the electrical characteristic, a value of the electrical characteristic of the cell second proximity context model;
generate a layout of cells having at least instance of the cell and having given devices neighboring the at least one instance of the cell, and having given proximity parameters that relate to a spacing between given regions of the at least one instance of the cell and given regions of the given devices neighboring the at least one instance;
classify at least one instance of the cell between the cell first proximity context model and the cell second proximity context model, based on the given proximity parameters; and
generate a discrete electrical characteristic model of the layout of cells by substituting, based on a result of the classifying, said at least one instance of the cell with one of the modeled first value and the modeled second value of the electrical characteristic.

94. An apparatus for modeling electrical characteristics of a layout of cells having given reference devices, comprising:
means for determining a relationship between a proximity context of a reference device among a set of reference devices, and an electrical characteristic among a set of electrical characteristics, wherein the proximity context is a spatial relationship of given physical regions of the reference device to given neighboring devices;
means for selecting, based at least in part on the determined relationship, a first reference proximity context at which, in accordance with the determined relationship, the electrical characteristic of the reference device corresponds to a first given value, and a second reference proximity context at which, in accordance with the determined relationship, the electrical characteristic of the reference device corresponds to a second given value;
means for generating, for the cell, a cell first proximity context model and a cell second proximity context model, wherein said generating a cell first proximity context model comprises modifying the model of the cell in accordance with the first reference proximity context, and said generating a cell second proximity context model comprises modifying the model of the cell in accordance with the second reference proximity context;
means for determining, as a modeled first value of the electrical characteristic, a value of the electrical characteristic of the cell first proximity context model and, as a modeled second value of the electrical characteristic, a value of the electrical characteristic of the cell second proximity context model;
means for generating a layout of cells having at least instance of the cell and having given devices neighboring the at least one instance of the cell, and having given proximity parameters that relate to a spacing between given regions of the at least one instance of the cell and given regions of the given devices neighboring the at least one instance;
means for classifying at least one instance of the cell between the cell first proximity context model and the cell second proximity context model, based on the given proximity parameters; and
means for generating a discrete electrical characteristic model of the layout of cells by substituting, based on a result of the classifying, said at least one instance of the cell with one of the modeled first value and the modeled second value of the electrical characteristic.

* * * * *